United States Patent [19]

Chen et al.

[11] Patent Number: 5,726,920

[45] Date of Patent: Mar. 10, 1998

[54] WATCHDOG SYSTEM HAVING DATA DIFFERENTIATING MEANS FOR USE IN MONITORING OF SEMICONDUCTOR WAFER TESTING LINE

[75] Inventors: Susan Hsuching Chen, Sunnyvale; Ying Shiau, San Jose; Chern-Jiann Lee, Los Altos, all of Calif.

[73] Assignee: Advanced Micro Devices, Inc., Sunnyvale, Calif.

[21] Appl. No.: 537,116

[22] Filed: Sep. 29, 1995

[51] Int. Cl.[6] .......................... H01L 21/66; H01L 21/304
[52] U.S. Cl. .............. 364/579; 437/8; 437/209; 324/73.1; 324/158.1
[58] Field of Search ................. 364/579, 552; 437/8, 180, 209, 51; 324/158.1, 73.1, 500, 537, 765; 360/25, 31; 357/40

[56] References Cited

U.S. PATENT DOCUMENTS

| | | | |
|---|---|---|---|
| 4,558,416 | 12/1985 | Pauwels et al. | 364/431.11 |
| 4,811,200 | 3/1989 | Wagner et al. | 364/200 |
| 4,875,002 | 10/1989 | Sakamoto et al. | 324/73 |
| 4,888,715 | 12/1989 | Tada et al. | 364/579 |
| 5,128,737 | 7/1992 | Van der Have | 357/40 |
| 5,210,041 | 5/1993 | Kobayashi et al. | 437/8 |
| 5,218,196 | 6/1993 | Dogul et al. | 395/575 |
| 5,341,497 | 8/1994 | Younger | 395/575 |
| 5,345,583 | 9/1994 | Davis | 395/575 |
| 5,384,784 | 1/1995 | Mori et al. | 364/579 |
| 5,499,340 | 3/1996 | Barritz | 364/579 |

*Primary Examiner*—Emanuel T. Voeltz
*Assistant Examiner*—Bryan Bui
*Attorney, Agent, or Firm*—Fliesler, Dubb, Meyer & Lovejoy

[57] ABSTRACT

In a final wafer sort (FWS) testing facility, the raw log-out data that is output by FWS test stations is augmented with additional differentiating data to thereby produce differentiable log-outs that can be sorted according to a variety of criteria including: product number or product family, time of test, specific wafer, specific production lot, intra-reticle site number, machine operator, and the specific swappable units of equipment that participated in the FWS testing. The differentiable log-outs are stored in a database and are periodically accessed by an automatic watchdog system that tests for exception conditions calling for immediate or long-term response. Corresponding alarm signals and trend reports are automatically generated and distributed to responsible personnel and/or reactive machine-systems as appropriate. The alarm distribution mechanism includes automatic paging of personnel by wireless beeper and/or e-mail. Immediate response alarms include exception conditions detected for accumulated bin counts on a per-wafer or per-lot basis. Long term alert reports include those that detect increased error rates and possible wear down of replaceable probe cards.

47 Claims, 8 Drawing Sheets

WATCHDOG SYSTEM HAVING DATA DIFFERENTIATING MEANS FOR USE IN MONITORING OF SEMICONDUCTOR WAFER TESTING LINE

BACKGROUND OF THE INVENTION

1. Field of the Invention

The invention relates generally to mass-production style semiconductor wafer testing and more particularly to so-called 'final wafer sort' (FWS) automated testing that occurs after WET test and prior to final packaging.

2. Background

The manufacture and delivery of fully-functional integrated circuit chips (IC chips) to end users is a complex operation involving many process steps.

The process steps may include but are not limited to the following chronologically ordered ones: (1) crystal growth; (2) ingot slicing; (3) bulk wafer doping and annealing; (4) photoresist deposition and lithographic patterning through stepper reticle; (5) field-oxide growth; (6) wafer planarizing; (7) local dopant implants; (8) gate and other dielectric growth and/or deposition; (9) polysilicon layer formation and etching; (10) metallization; (11) surface cleaning and passivation; (12) wafer-level testing; (13) wafer dicing; (14) individual die packaging; (15) final testing; and (16) shipping to end users.

A typical, modern-day integrated circuit chip undergoes hundreds of process steps before it is ready for final packaging, testing and shipment to customers. At each process step, there is a danger that something will go wrong and cause the final IC product to malfunction or not perform according to specifications.

Tests should be performed periodically along the fabrication and delivery stream in order to detect defective wafers or chips.

It is desirable to isolate completely-defective wafers as far upstream on the production line as possible and to weed out such defective wafers at the earliest possible point.

Early removal of defective product helps to avoid waste of downstream resources, waste of energy, and waste of time in the processing of IC chips that would otherwise ultimately prove to be useless if allowed to proceed further down the production/delivery stream.

Obviously, as each wafer proceeds without major defect further down the production line the value of the wafer increases.

At each successive production step the wafer and its included chips have so many more process steps and so much more production time cumulatively invested into them. Each time a wafer passes successfully through a next-succeeding test station, that wafer can be considered more and more likely to be a wafer that will ultimately produce a good yield of useful end product (a relatively large number of fully-functional integrated circuits).

At the end of the wafer processing line, there are two basically-final tests that are very important for last-minute weeding out of wholly-defective wafers and/or for weeding out of on-wafer defective dice. The two basically-final tests occur before the wafers are diced and subdivided into a large number (e.g., hundreds) of individual chips. The chips are thereafter packaged and re-tested on a chip-by-chip basis prior to shipment.

The first of the end-of-the-line basic tests for the still-intact (not yet diced) wafers is referred to as "Wafer Electrical Testing", or WET. In this test, one or a few on-wafer basic elements such as transistors, resistors, capacitors, and/or conductors are tested for basic electrical functionality. (The on-wafer basic element can even be a so-called in-scribe polysilicon line which is situated on a scribe line and is destroyed when the wafer is later scribed.)

If the WET test fails because one or more of the probed basic elements does not operate as it should (e.g., the resistance of the in-scribe polysilicon line is outside of an acceptable range), then it is fairly certain that the defect repeats across the entire wafer and that higher-level functionalities of the wafer will also not work properly. It is fairly certain that a wafer failing the WET test is wholly-defective, and that such a wafer should be discarded rather than being allowed to proceed further downstream.

The discard of a wafer at the WET test stage is considered a fairly serious matter. So much time and work effort has already been invested into the wafer to bring it to this end-of-the line checkpoint. Significant value may be lost if a wafer is erroneously deemed to be wholly-defective and discarded at this point when in fact the wafer is good.

Fortunately, the WET test is generally simple to do and can be performed relatively quickly (e.g., in one to ten minutes per wafer depending on design specifics). A failed wafer can be retested a number of times at the WET test stage before being discarded to make sure it is truly the wafer rather than the WET test or noise factors that is producing the failure results.

After WET test there is a more complicated, second end-of-the-line basic test which is commonly referred to as final wafer sort (FWS). Here, the higher level functionalities of each circuit on the wafer are tested. For example, if the wafer holds an array of microprocessor chips, the speed and functionality of those chips will be tested to make sure that each is within a predefined set of specifications. By way of further example, if the wafer holds an array of nonvolatile electrically reprogrammable memory circuits (e.g., flash EEPROM), the programmability and data retention characteristics of the individual circuits will be tested.

Failed dice (IC chips) are denoted as such within the final wafer sort procedure by inking each such die and/or by otherwise recording the identity and failed status of the die.

The end-of-the-line wafer sort test (FWS) is characterized as being relatively complex to perform and time-consuming. Depending on the specific product-line being tested (e.g., microprocessors versus much simpler logic arrays), the wafer sort test can require anywhere from a few minutes per wafer to a few hours per wafer.

The type of test equipment that must be employed for the end-of-the-line wafer sort test is usually relatively expensive. As such, the number of FWS test stations available within a fabrication plant is usually quite small. The test equipment used in final wafer sort typically comes in three generic flavors: (1) logic, (2) memory, and (3) analog. There are only a few of each type of test station in a conventional fabrication plant.

If all the in-plant FWS memory test stations are consumed for wafer sort testing of a first memory product (e.g., SRAM chips), then the advancement of other memory products (e.g., flash EEPROM chips) through the final wafer sort stage will be delayed until one or more of the memory-testing types of FWS stations successfully finishes testing its allotment of the first memory product (e.g., the SRAM chips).

If a problem develops in the FWS testing of the first product (e.g., the SRAM chips), not only is the shipment of the first product delayed, but the shipping date for not-yet-tested next product (e.g., the flash EEPROM) may also disadvantageously slip behind schedule.

Because a relatively large amount of time is consumed for the final wafer sort testing (FWS) of each wafer, and because the number of available FWS test stations is usually limited, it is often deemed not economical to repeat the final wafer sort testing for a given wafer or batch of wafers even if it/they have a high number of failed chips. New batches of wafers keep coming off the production stream, each bearing a promising load of new and perhaps more valuable chips. The new batches would be held up for too long a time and a severe backlog may develop in the over all production line if one had to re-test a large number of highly-complex wafers at a given FWS test station.

On the other hand, it is also deemed economically imprudent to discard a large number of wafers or chips at a given FWS test station if the unusually high failure rate is the result of erroneous testing rather than faulty manufacture.

And to make the situation more enigmatic, it is also deemed economically unwise to keep the production line going if there is something seriously wrong in the manufacture process. If one is seeing a high rate of failure at the final wafer sort stations and the high rate is due to a manufacturing problem at a particular production station rather than due to testing problem, then it may be advantageous to stop the production of the affected products and fix the problems of the production station rather than to keep wasting the downstream resources of the production line.

On the other hand, if an unusually high FWS failure rate is due to a testing problem or due to a statistical glitch, then it is extremely disadvantageous to stop the production line in response to the observation of this unusually high FWS failure rate.

A difficult enigma therefore develops at the final wafer sort (FWS) stations. If an unexpectedly high number of test failures is observed, should one conclude that this high failure rate is due to a manufacturing problem or due to a testing problem? Is the high failure rate merely a statistical glitch? Should the failed individual wafer or batch of wafers be re-tested or discarded? Should one or more of the limited number of FWS test stations be taken off-line for refurbishment or repair? Should the entire manufacturing line be shut down?

The economic well-being of a production plant depends on how accurate and quick one is, on average, in determining whether unusual numbers of failures are occurring at final wafer sort testing (FWS), and if so, whether these failures are due to test procedure errors, or due to test equipment problems, or due to statistical quirks, or due to manufacturing defects; and on how quickly one is able to take corrective action when needed after a determination is made.

SUMMARY OF THE INVENTION

It is an object of the invention to provide a system for determining quickly and with a fair degree of accuracy whether unusual numbers of failures are occurring at final wafer sort testing, and if so, whether these failures are due to test procedure errors, or test equipment problems, or statistical quirks, or manufacturing defects.

A system in accordance with the invention comprises:
(a) data collection means for collecting blocks of raw test result data from test equipment;
(b) data differentiating means for adding differentiating information to the collected raw test results to enable differentiation of said raw data according to one or more predefined sorting criteria such as specific product design, product-line, specific production lot, specific test dates and times, specific test locations, and specific probe cards;
(c) sorting means for sorting the collected and differentiable test result blocks according to one or more of the predefined sorting criteria;
(d) statistics generating means for receiving the sorted blocks of test data and generating therefrom immediate statistical information blocks for each sorted category and/or long-term historical trend information blocks for each sorted category;
(e) comparing means for receiving the sorted blocks of test data and/or the corresponding immediate or historical statistical information blocks, for comparing the sorted blocks or statistical information blocks against predefined, correspondingly sorted normal-range data, and for generating therefrom exception signals indicating out-of-range conditions for those of the compared sorted blocks of test data or for those of the compared statistical information blocks that are out-of-range with respect to the corresponding normal-range data;
(f) alarm means for generating an alarm signal for each exception signal;
(g) trend reporting means for reporting statistical trend reports indicating deterioration other changed conditions in test equipment;
(h) automatic work re-routing means for re-routing work from defective test equipment to known-good test equipment; and
(i) distribution means for automatically distributing alarm signals and trend reports to responsible personnel or automated alarm and report processing means.

BRIEF DESCRIPTION OF THE DRAWINGS

The invention will be further described with reference to the following drawings, in which.

DETAILED DESCRIPTION OF THE DRAWINGS

Figure 1A:
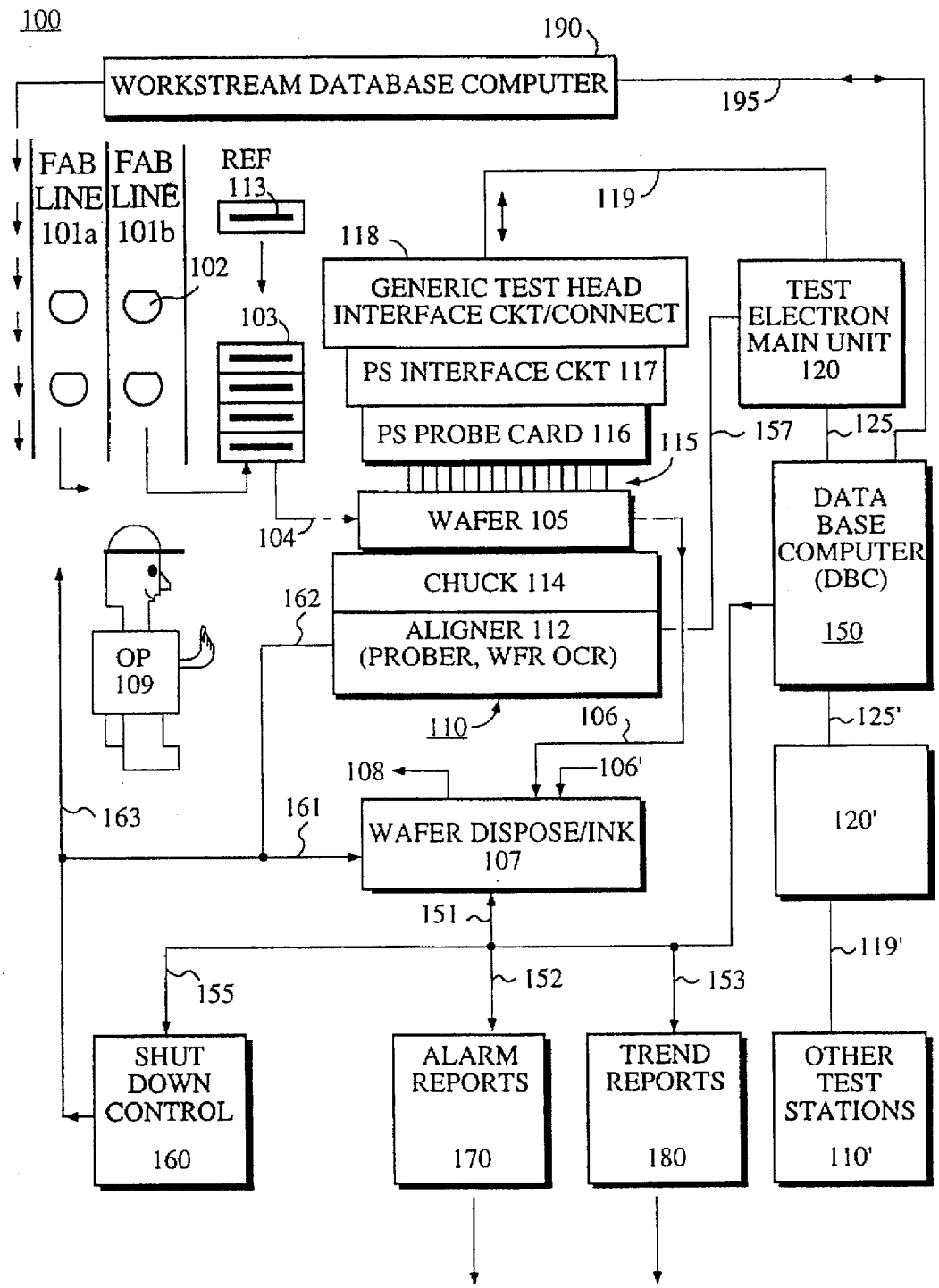
FIG. 1A is a block diagram of showing a wafer production and test system that may be structured and operated in accordance with the invention.

FIG. 1A is a block diagram of a wafer production and test system 100 that may be operated in accordance with the invention.

Paths 101a and 101b are representative of a plurality of wafer fabrication lines that produce finished wafers 102.

The outflowing streams of wafers 102 from fabrication lines 101a and 101b have not yet gone through final wafer testing. Each produced wafer 102 is associated with a respective stream (e.g., 101a or 101b) of fabrication line equipment through which the wafer 102 flowed as various process steps were performed to transform the wafer from a raw to a finished product.

A workstream database computer 190 tracks the progress of each wafer 102, or the progress of each lot of plural wafers, through its respective stream of fabrication line equipment and notes when each wafer has passed through each successive process step in that stream (e.g., 101a or 101b).

The workstream database computer 190 includes cross-reference means (not shown) for cross referencing a given lot number with individual identification numbers of wafers contained in that lot, for cross referencing a given lot number with individual identification numbers of line equipment that have processed that lot, for cross referencing a given lot number with a corresponding product identification number, and for cross referencing a given lot number with a date and time on which the lot is indicated to have been 'released' from one processing stage for further work in a subsequent processing stage.

Although not shown in FIG. 1A, it is understood that each stream of fabrication line equipment, 101a or 101b, typically includes stepper equipment (e.g., a photoresist patterning stepper) that individually defines each of plural reticle areas on each wafer 102. Each reticle area typically contains a plural number of dice arranged as a rectangular matrix such as 2 dice horizontally by 3 dice vertically. The reticle areas generally tile a working surface portion of the wafer in some non-overlapping fashion. Each reticle area preferably has its own alignment indicia for helping automated equipment to align with integrated circuit dice inside that reticle area.

Each finished die of a given reticle area is expected to have substantially identical circuitry to that of every other die in the given reticle area. But of course, occasional defects do crop up along the production stream in one or more specific dice, which is why final wafer testing is carried out as wafers flow out from the end of each stream, 101a, 101b, etc.

The finished wafers 102 that flow out from each fabrication line stream such as 101a and 101b are usually grouped in lots and each lot of wafers is usually loaded into a respective transport cassette such as 103. Each cassette 103 is then conveyed by an operator 109 and/or conveyed automatically into test equipment such as FWS test station 110 for final wafer sort testing.

A robotic arm (not shown, but understood to be part of a below-described prober) typically removes the wafers from the transport cassette 103 one at a time and places the wafers one at a time on a wafer-holding chuck 114 as indicated by movement path 104. WET testing is understood to have already occurred along the movement path 104 prior to insertion into the FWS test station 110.

During the time that a given wafer is placed on the holding chuck 114 the given wafer is referred to as the wafer-under-test (WUT) 105.

An automatic alignment system 112 moves the on-chuck wafer-under-test 105 into alignment with a plurality of overhead probes 115 using alignment marks found on the WUT 105. The combination of the alignment system 112, the chuck 114, and the wafer-transporting robot arm (not shown) is typically referred to as a "prober".

The operations of the prober 112–114 are controlled by a test-station mainframe unit 120 via a control connection such as shown at 157.

Figure 5:
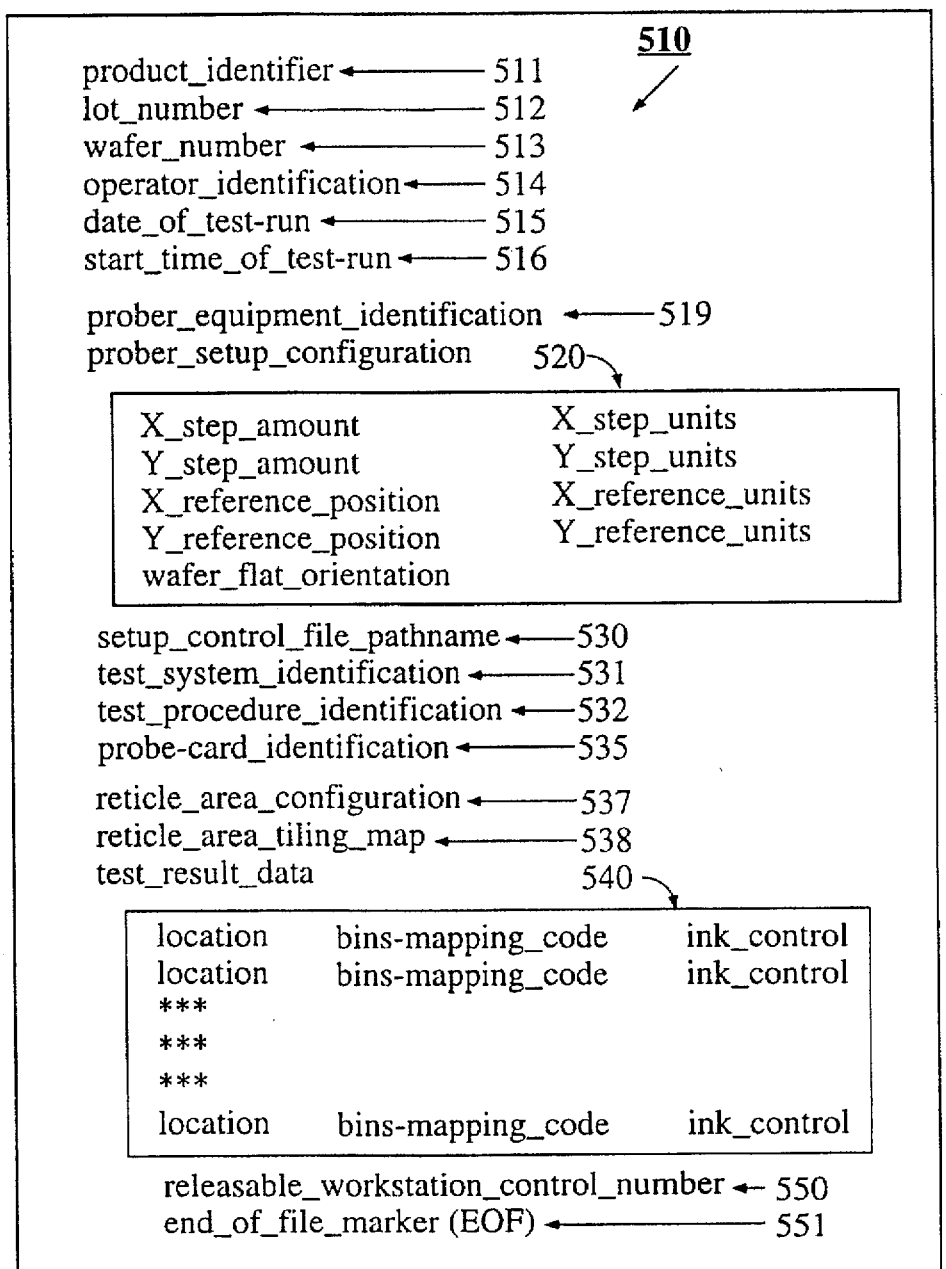
FIG. 5 shows a storage medium having a differentiable log-out data structure in accordance with the invention.

An optical character recognition (OCR) mechanism is preferably included in the prober 112–114 for automatically reading identification information that is normally laser-inscribed on or about the flat edge of each loaded wafer 105 and identifies the wafer according to an assigned wafer number and/or according to an assigned lot number and/or and according to an assigned product number associated with the specific circuitry contained on that wafer 105. The OCR-input identification information is fed to a database computer 150 by way of a mainframe unit 120 for inclusion in a below-described data structure 510 (FIG. 5).

Once alignment is achieved by the prober 112–114 (and preferably after the wafer's OCR identification information is automatically input and further automatically checked to make sure the correct wafer 105 is present on the chuck 114), a reciprocating test head 115–118, which holds probes 115, is brought down to engage the probes 115 with the aligned on-chuck wafer 105. The test head probes 115 may contact one die at a time or may contact multiple dice of the WUT 105 simultaneously. Typically, the prober steps the wafer laterally for bringing each successive die under the test head probes 115 and the test head 115–118 respectively reciprocates up away from the wafer-under-test 105 before the lateral step and then back down to contact the next die at the end of the prober lateral step.

The test head 115–118 is usually subdivided into product-specific portions and generic portions. Each specific product that comes off the fabrication line streams 101a, 101b, such as a microprocessor chip, or an SRAM memory chip, or a flash EEPROM memory chip, typically has a unique, 2-dimensional pattern of contact pads and needs a corresponding 2-dimensional pattern of probes 115 for mating with its respective pattern of contact pads. Each specific product also frequently needs its own, product-specific test electronics for interfacing with the unique electronics of that product. (E.g., specific voltage levels, input signal patterns, specific data rates, etc. See FIG. 1B for more detailed view of product-specific and generic test-head portions.)

To meet the unique needs of each product within a given product-line (e.g., microprocessors, memory chips, gate arrays, etc.) the probes 115 are mounted on a product-specific (PS) probe card 116 in accordance with the contact-pad pattern of the wafer-under-test 105.

A product-specific (PS) interface circuit 117 is typically integrated onto the PS probe card 116. In some older systems, the PS interface circuit 117 may be placed on a separate printed circuit board which then removably connects to the probe card 116.

The product-specific interface circuit 117 typically connects in disconnectable fashion to a standardized connector 118 which then connects to a generic test head interface circuit (also designated 118).

A flexible cable 119 connects the vertically reciprocating test head (which head comprises elements 115–118) to a test station mainframe unit 120 containing further test electronics and instructions for carrying out automated test sequences. The mainframe unit 120 is programmably configurable to respond to a prespecified setup control program during a so-called setup phase preceding production testing and to a prespecified test-procedure control program during the FWS testing of a production lot of wafers.

The combination of the test head 115–118 and the mainframe unit electronics 120 includes circuitry for automatically testing the on-chuck wafer 105 and for determining whether the integrated circuit dice on wafer 105 each meets a variety of high-level operational requirements.

The combination of the prober subsystem 112–114, the product-specific test head subsystem 115–117, the generic test head subsystem 118–119 and the mainframe unit 120 defines the test station 110 performing FWS testing on the on-chuck wafer 105. It should be appreciated that each subsystem or unit of test equipment such as the probe card 116 is swappable with another equivalent unit (e.g., another probe card 116' that is also specific to the same particular product). The units of test equipment that make up a particular test station 110 at one point in time are not necessarily the same as those that make up the same-named test station 110 at another point in time even if the same product line is being tested at both time points by the same-named test station 110. The prober subsystem 112–114 may be replaced by another prober subsystem 112'–114' (not shown) in the midst of testing the one product line or the product-specific test head subsystem 115–117 may be replaced by another product-specific test head subsystem 115'–117' (not shown) in the midst of testing the one product line for a variety of reasons.

The high-level operational requirements to be tested for and met by each die may include but are not limited to: (a) proper interconnect between each test contact pad and/or each pin bonding pad to its associated on-chip circuitry; (b) proper electrical isolation between on-chip circuits that are not supposed to be shorted together; (c) appropriate power consumption by the IC chip; (d) sufficient response speed by the on-chip circuitry; (e) proper data storage operation by on-chip memory units; and (f) proper digital or analog functionality of respective on-chip logic and analog circuits.

Test data signals 125 generated by the test station electronics 115–120 is transmitted by way of cable (or by of other data conveyance means such as disk, tape, flash memory cards) to a database computer (DBC) 150 for storage in a memory means of the DBC. The database computer 150 analyzes the received data and determines therefrom which of a number of possible actions are to be taken next with respect to the data-supplying test station 110, with respect to its source of test wafers 101b, 103, and with respect to further downstream stations such as a below-described wafer disposition/inking station 107.

As seen in FIG. 1A, the DBC 150 typically receives additional test data signals 125' from additional test stations such as 110' (that are similar to first test station 110) by way of additional cables such as for data 125' (or other conveyance means—not shown). The database computer 150 analyzes the received data 125' to determine therefrom which of a number of possible actions are to be taken next with respect to the additional test station(s) 110', with respect to its/their wafer sources (not shown) and with respect to its/their downstream destinations (107', 108', not shown).

The wafer-sort database computer 150 is coupled by way of connection 195 to the workstream database computer 190. One of the functions provided over connection 195 is a transmission of an indication from the DBC 150 to the workstream database computer 190 that a particular wafer or lot of wafers has moved through the final wafer sort stage onto a wafer dicing stage that is indicated as next-stage 108.

Each tested wafer 105 is transferred, after being tested at a respective test station 110, 110' to a corresponding wafer disposition/inking station 107 as indicated by movement flow paths 106, 106'.

A number of different actions may take place at the wafer disposition/inking station 107: (1) The entire tested wafer 105 may be discarded. (2) A subset of the on-wafer dice may be identified by inking and/or other means for subsequent discard. (3) The entire tested wafer 105 may be forwarded to a subsequent dicing station (not shown) without any of its dice being inked or otherwise identified for post-dicing discard. (4) The tested wafer 105 may be returned to its original or another FWS test station 110, 110' for further testing.

If the wafer is not discarded or returned, it continues along movement path 108 to a dicing station (not shown). The DBC 150 indicates the corresponding release for dicing to the workstream database computer 190. After dicing, each die that was found to be defective during the final wafer sort test is discarded while chips that passed the FWS test are forwarded to a packaging station (not shown) for packaging and further testing.

The database computer (DBC) 150 controls the wafer disposition/inking station 107, as indicated by connection 151. Based on test data received for the corresponding wafer, the DBC 150 determines if and when each tested wafer 105 is to be completely discarded, and if not, which defective dice (IC chips), if any, on each wafer are to be marked for discard.

The wafer disposition/inking station 107 typically includes a robotic mechanism (not shown) which responds according to commands sent by way of connection 151 from the DBC 150 and selectively removes wholly-defective wafers from the transport cassette 103 before the cassette moves on, down path 108. The robotic mechanism of the wafer disposition/inking station 107 my also selectively ink and/or otherwise identify each bad die on each otherwise useable wafer before that wafer is next-diced into individual IC chips. Bad-die and/or bad-wafer identifications may be alternatively or supplementally made on a memory means that travels with or is otherwise associated with the test cassette 103.

The database computer 150 is further responsible for generating and routing alarm signals 170 to the equipment operator 109 and/or other authorized personnel in situations where the DBC 150 determines from the collected data (125, 125') that the test equipment is not working properly and that immediate corrective action needs to be taken.

By way of example, it might be determined by the DBC that the wrong product-specific probe card 116 has been mounted into the test head 115–118. In such a case, every die on the wafer-under-test 105 will probably fail the FWS test due to incorrect alignment between the probes 115 and the on-wafer contact pads. Damage may occur to chips that are probed at points other than their contact pads. If the wrong product-specific probe card 116 has indeed been mounted, the testing procedure should be stopped as soon as possible and the operator 109 should be instructed by way of an alarm message (or signal) 170 to insert the proper probe card 116 into the test head fixture.

Alarm signals (messages) 170 may be further or alternatively sent via electronic mail (e-mail) and/or via paging by way of wireless beeper and/or via telephonic voice-mail to other persons as identified in a pre-stored, computer-readable distribution list and as associated through that list with pre-assigned levels of alarm signals.

Aside from generating alarm signals 170 as indicated by control path 152, the database computer 150 also asserts via path 155, and through an authorizing shutdown control module 160, automatic shutdown control instructions directed to a variety of process steps, including to those of the downstream wafer disposition/inking station 107 as indicated by control path 161; to the currently executing test procedure as indicated by control line 162; and even (in extreme situations) to upstream production steps 101a, 101b as indicated by control line 163. In one embodiment, human authorization is required before the upstream production steps 101a, 101b can be shutdown on the basis of a recommendation made by the DBC 150.

As will be explained in more detail below, the database computer 150 can use data gathered over time from various sources (125, 125') to determine that an excessive number of failures are being detected and that their is a high probability (e.g., better than 90%) that the problem lies upstream in a given fabrication line 101a rather than at any specific testing station 110, 110' or associated test procedure. In such a case, it does not make sense to continue testing the output of the defective fabrication line 101a and wasting the time of the operator 109 and further wasting the test station resources 110, 110'. Instead, it may be more prudent to switch to the testing of an output from a different fabrication line 101b (e.g., for a different product such as a flash EEPROM memory chip instead of an SRAM chip) and to issue a shutdown instruction or recommendation 163 for the defective fabrication line 101a. (The conclusion that the FWS test station 110 is operating properly and the fault lies instead with the supplying fabrication line 101a should be verified by using a known-good wafer 113 to test the suspect FWS test station 110 before a line shutdown is authorized.)

In another scenario, the database computer 150 may use information (125, 125') collected over time from the test stations to determine that a specific piece of FWS test equipment 110 is in some way defective and is identifying too many dice as being bad when in fact the dice may be good. In such a case, it is prudent to send a control instruction 161 to the wafer disposition/inking station 107 so that station 107 does not discard wafers, or mark as bad the dice that were tested by the potentially defective FWS station 110. Wafer disposition/inking station 107 might be instructed by way of control path 161 to instead return the wafers for further testing by a different, known-to-be-good test station 110'.

Once a defective piece of test equipment is identified, its operations are preferably halted, as indicated by shutdown control path 162, so that time and resources are not wasted in generating further bad test data and so that good product (wafers and IC chips) is not erroneously discarded.

In addition to generating instantaneous alarm signals 170, the database computer 150 is also responsible for periodically generating long-term historical trend reports 180. These trend reports 180 are generated from data 125, 125', gathered over the long term from various pieces of test equipment 110, 110'. The trend reports 180 are routed to human and/or machine-implemented analyzers (not shown) for further consideration and action per a pre-stored, computer-readable distribution list. The trend reports 180 may be printed or sent via electronic mail (e-mail) and/or via other networking facilities as appropriate and on a priority basis commensurate with the urgency of taking responsive action for the given reported trend.

By way of an example of the kind of information that may be contained in a trend report, assume that the probes 115 on a specific probe card 116 are deteriorating over time due to the wear and tear of usage. It is preferable to replace a worn-down probe card 115–116 before it produces bad test results rather than waiting for the failure to occur. But it is not desirable to replace a probe card 115–116 prematurely since each such product-specific card is relatively expensive and replacement consumes time that could be better spent testing more wafers. It is desirable to identify an ideal replacement time point at which maximum utilization will have been obtained from each probe card 115–116 but testing time and good dice will not be lost due to excessive probe card deterioration. The long-term trend reports 180 produced by DBC 150 may be used to obtain maximum lifetime from each probe card 115–116 while avoiding excessive loss of good product due to an overly worn-down probe card.

By way of another example of what may be in a trend report, assume that data from separate cleanroom-particle counting equipment is combined with the log-out test data. Assume the combined data shows rising levels of test failure and rising levels of air particles correlating over time. Given these two correlated trends, an administrator can decide that corrective action has to be taken with respect to the room air cleaning equipment.

By way of yet another example of a trend report, assume that a collection of test data that is correlated to a particular operator 109 shows progressively higher levels of test failure correlating over time with that one operator 109. In such a case, an administrator may decide that corrective action has to be taken with respect to that operator.

Figure 1B:
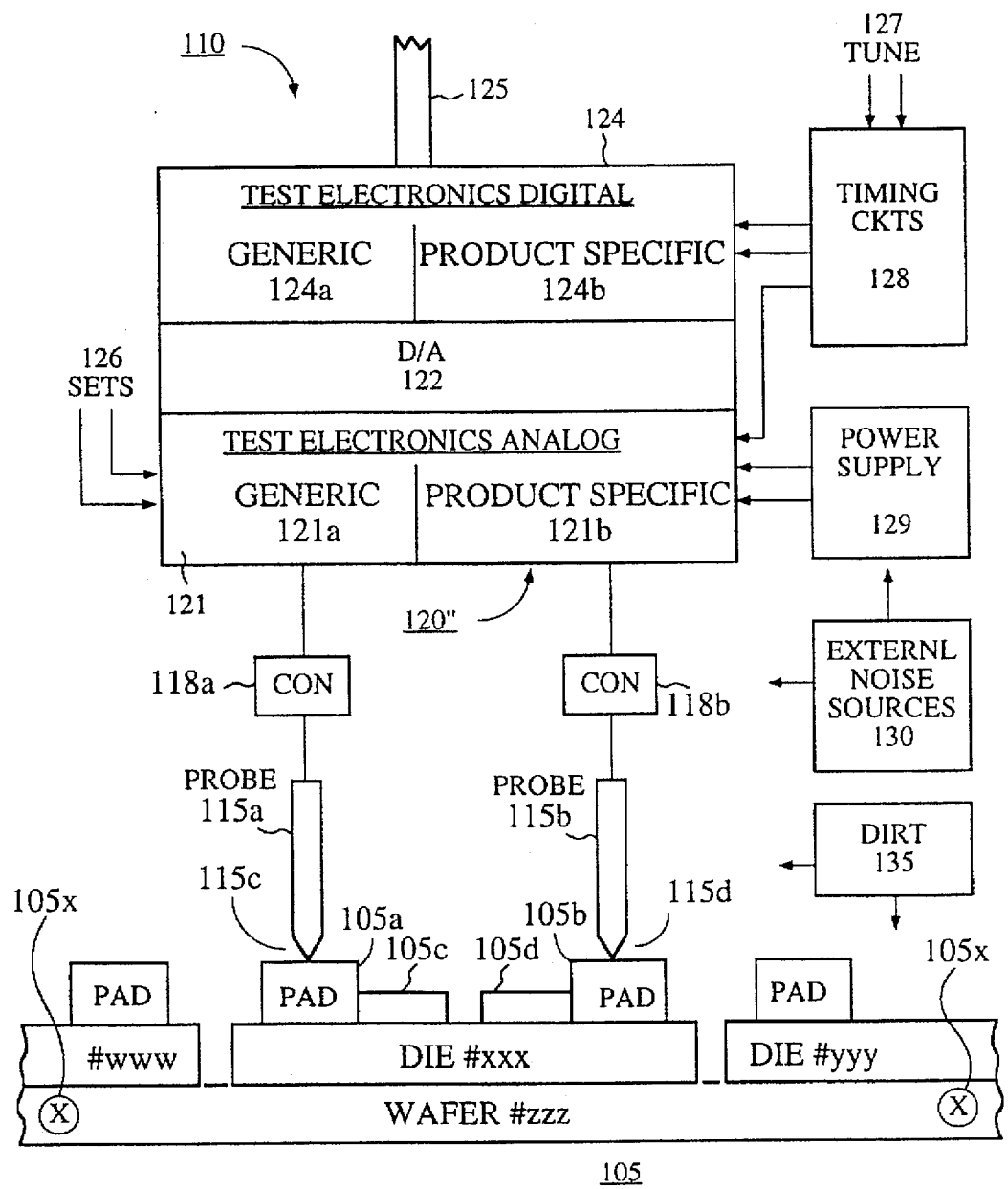
FIGURE 1B is a schematic diagram showing details of the wafer-under-test, the test probes and the test electronics.

Referring to FIG. 1B, there are a number of mechanisms that may lead to erroneous test data. Erroneous test data is data that indicates a specific die or wafer is failing although that die/wafer is good.

As seen in the detailed side view of FIG. 1B, each wafer 105 has a specific identification number such as #zzz. The wafer 105 contains a plurality of same-design IC dice, each uniquely identified by an identifying indicator such as #www, #xxx, #yyy. The identity #xxx of each die may be devised according to on-wafer location or according to some other criteria (e.g., intra-reticle site number or position within an identified reticle area #vvv, see FIG. 2B).

On each die, e.g. #xxx, a plurality of contact pads such as 105a, 105b, are provided in accordance with a predefined geometric positioning pattern.

The product-specific probe card 116 that has been inserted into the test head should contain a plurality of probes, such as 115a, 115b, that are positionally patterned to align with and engage with the contact pads 105a, 105b of the underlying die #xxx. The bottom tips 115c, 115d of the respective probes 115a, 115b, make actual physical and electrical contact with the respective pads 105a, 105b when the test head 115–118 is brought into engagement with the wafer-under-test 105.

Connectors such as 118a, 118b, may be used within the test head fixture for providing disconnectable electrical coupling between the probes 115a, 115b and other parts of the test electronics 120".

The test electronics 120" may be subdivided into an analog section 121, a digital-to/from-analog (D/A) interface section 122, and a digital section 124.

Each of test sections 121, 122, 124 may be further subdivided into a product-specific section and a test-generic section.

Each product-specific portion of the test electronics 120" is typically included within the replaceable product-specific interface circuit 117 and changes with the use of different probe cards for different specific products (e.g., SRAM, or DRAM, or EPROM (electrically programmable read only memory), or flash EEPROM (electrically re-programmable read only memory) memory chips).

The generic test electronics generally remain affixed to the test equipment 110 irrespective of the specific product under test although, of course, these generic parts may be replaced or reconfigured as needed.

One or more power supplies 129 provide various voltage levels and other forms of power to the test electronics 120". Power supply levels may have to be set on a product-by-product basis to test products of different designs. Analog threshold levels may have to be adjusted on a product-by-product basis or even on a test-run by test-run basis. The inputs for adjusting variable parameters within the test electronics 120" is shown generally at 126 and designated as the 'set controls' for the test electronics 120".

One or more clock and timing circuits 128 may be included within the test fixture for establishing timing references within the test electronics 120". The timing circuits 128 may have to be adjusted on a product-by-product basis, or on a test-run by test-run basis in order to meet certain test requirements. The adjustment inputs for the timing circuits 128 are indicated generally at 127 and referred to as the timing tuning signals.

Referring to FIG. 1A, before a series of untested, off-the-production-line wafers 102 are tested, the equipment operator 109 will typically load a reference wafer 113 into the test station 110. The reference wafer 113 is a pre-tested wafer that has known-good dice.

One or both of the operator 109 and automated portions of the test electronics 120" will repeatedly run the FWS test on the reference wafer 113 and adjust the equipment variables 126, 127 (FIG. 1B) until the reference wafer 113 repeatedly produces valid test results 125. This is known as 'set-up'.

After the set-up procedure completes, the reference wafer 113 is removed and the test procedure advances to the testing of the un-tested, off-production-line wafers 102.

Due to the automated nature of the equipment, the mainframe unit 120 will output log-outs of the repeated set-up results for the reference wafer 113 in the same fashion that it outputs test results for the off-the-production-line wafers 103.

Referring to FIG. 1B, production-line wafers 105 move into engagement with the test head 115–118, one after the next, by way of robotic manipulation. Each wafer and/or each reticle area has alignment marks 105x or other means provided thereon for enabling the alignment mechanism 112 (FIG. 1A) to align the contact pads 105a, 105b under respective probe tips 115c, 115d. If alignment proceeds correctly, the test head can be brought down for engaging the probe tips 115c, 115d with the respective contact pads 105c, 105d.

A number of things may go wrong during this initial part of the FWS test procedure. The on-wafer alignment marks 105x of a non-reference wafer may be obscured by dirt 135, or some other defect may develop in the alignment mechanism 112 which causes misalignment between the probes 115a, 115b and the contact pads 105a, 105b. Dirt 135 may become lodged between the probe tips 115c, 115d and the respective contact pads 105a, 105b such that good electrical connection is not made. One of the probe tips 115c, 115d may be bent, broken off, or worn out such that it does not make proper contact with its respective pad. One of the test fixture contacts 118a, 118b may become defective and may as a result create an open circuit condition in a part of the test electronics 120" located above the probe to pad contact point. In each of these circumstances, the test results (125) will report one or more open circuits corresponding to a respective one or more pads 105a, 105b.

It has been empirically found that a more common reason for an open circuit failure is due to a fault mechanism within the test fixture 110 itself rather than due to a defect of the wafer-under-test 105. Chuck misalignment will generally result in a report of open paths for most of the pads on the wafer 105. Worn out or broken probe tips 115c, 115d will generally result in repeated open circuit reports for a select one or a few of all the pads on the chip. Problems with the test fixture connectors 118a, 118b will also produce partial failures of the open circuit type.

The database computer 150 may be able to use collected test data to recognize, after having tested one or more wafers 105, that the reason for the open circuit problems more probably lies with a given test fixture 110, 110' and not with the wafers themselves.

After establishing that proper electrical contact is being made with each of the contact pads 105a, 105b, the test system searches for isolation faults such as undesired shorts between various pads. Each pad 105a, 105b connects to on-chip circuitry by way of finely-patterned conductors (e.g., on-chip metal paths) such as 105c and 105d. The spacing between conductors 105c, 105d is typically so fine that undesired shorts can develop between these conductors during fabrication. Detection of inter-pad shorts generally indicates a production problem such as undesired shorting between on-chip interconnect paths such as 105c and 105d. Short circuits are rarely due, although it may happen, to adjacent probe tips being bent to contact one another. The database computer 150 may be able to use collected differentiable data to differentiate between short circuit problems due to fabrication line defects and short circuit problems due to defects in a specific test fixture 110, 110'. Typically, the known-good reference wafer 113 is used to verify that there are no short circuit problems in the specific test fixture 110, 110' as opposed to similar problems in the wafer-under-test 105.

After it is determined that there are no unexpected open or short circuits between the on-wafer pads 105a, 105b, the test fixture 110 applies power to the power pads of each die-under-test to determine whether the chip under test (die #xxx) draws an expected amount of power. Consumption of too much or too little power by a given die indicates a problem with that die.

There are often on-chip delay circuits within the die-under-test (#xxx) which allow the test fixture 110 to test the signal propagation times of the chip circuitry. Response times that are outside of an expected range indicate a problem. Sometimes the problem is due to improper tuning of the test fixture timing circuits 128 rather than due to problems with the die itself. Sometimes external noise sources 130 are present and these generate spurious spikes that give incorrect results for the circuit speed tests. The database computer 150 may be able to use collected differentiable test data to differentiate between speed test failures due to on-chip problems as opposed to speed test failures due to other causes.

With each specific product line, the test fixture 110 will be configured to conduct additional tests relating to that product line. By way of example, if the circuit-under-test includes EEPROM devices (electrically erasable and reprogrammable nonvolatile memory devices), the programmability and data retention characteristics of each memory cell within those devices will usually be tested. If the chip-under-test incorporates digital logic, the proper static and dynamic functioning of the logic circuits will be tested. If the chip-under-test includes analog circuits, those will also be tested for appropriate responses.

Figure 2A:
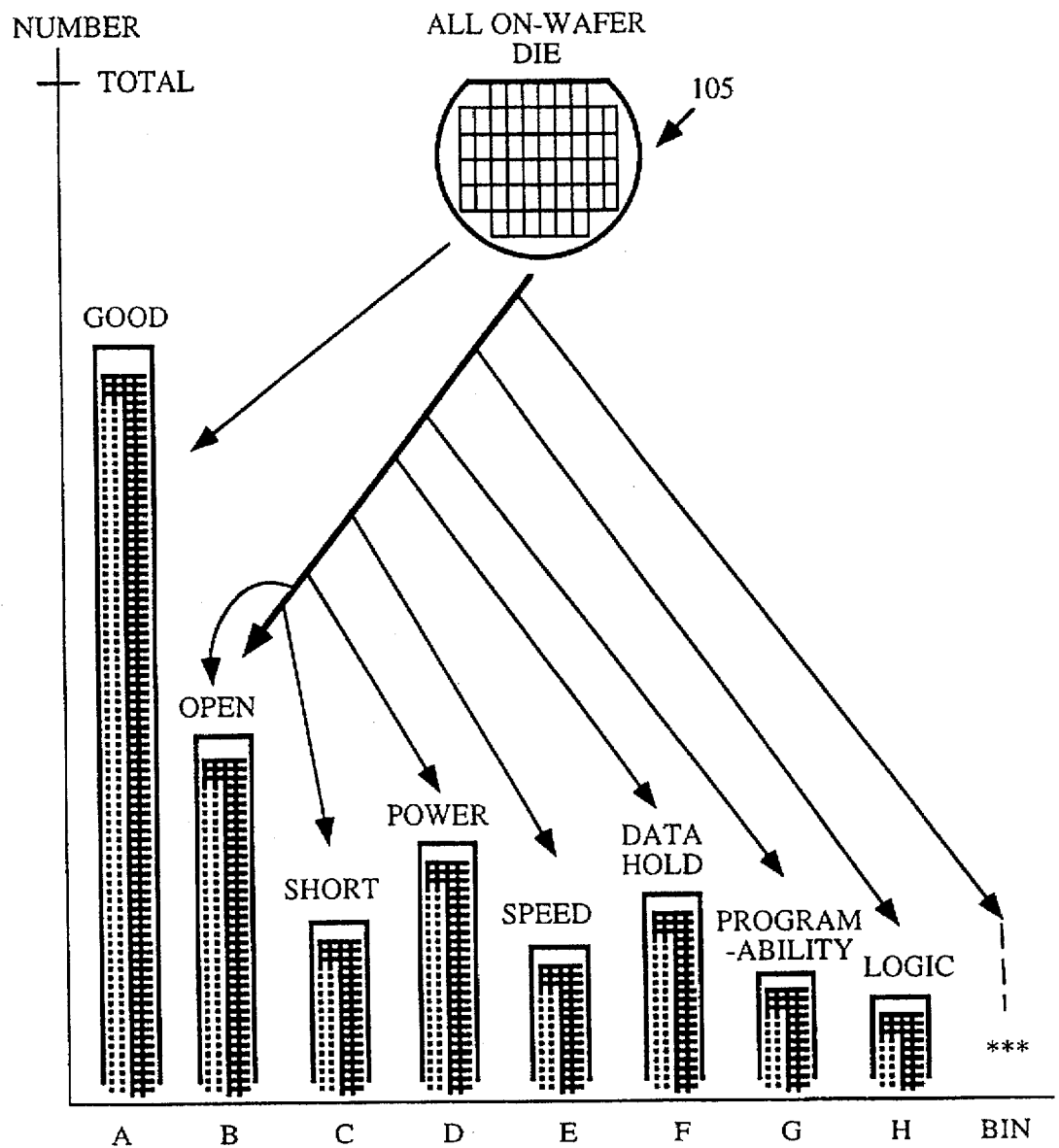
FIG. 2A is a bar graph showing how on-wafer dice are assigned to various test-result bins.

Referring to FIG. 2A, after all the dice on a given wafer have been tested by FWS equipment, a profile of the wafer is developed by assigning each die either to a good die bin (A) or to one or more of plural failure bins (B)–(H). The ratio between the number of good die in bin (A) and the total number of die on the wafer 105 defines the FWS yield of the wafer. The number of die participating in each of the remaining failure bins (B)–(H) provides other profile data about the validity of the test results, characteristics of the wafer batch under test, and long term trends.

By way of example, if the yield is very low across all dice (irrespective of intra-reticle site number, see below discussion of FIG. 2B) and the number of open circuits accumulated in bin (B) is relatively high, this generally indicates a problem with the test fixture such as misalignment or use of a wrong probe card, particularly if it occurs wafer after wafer.

If the FWS yield is relatively low and the number of short circuits accumulated in bin (C) is relatively high, this usually indicates a production line failure such as improper etching of the metallization layers.

If FWS yield begins relatively high on a given test fixture 110 and then slowly erodes over time, this may indicate deterioration of the probe card tips or other wear and tear problems within the test fixture 110.

Figure 2B:
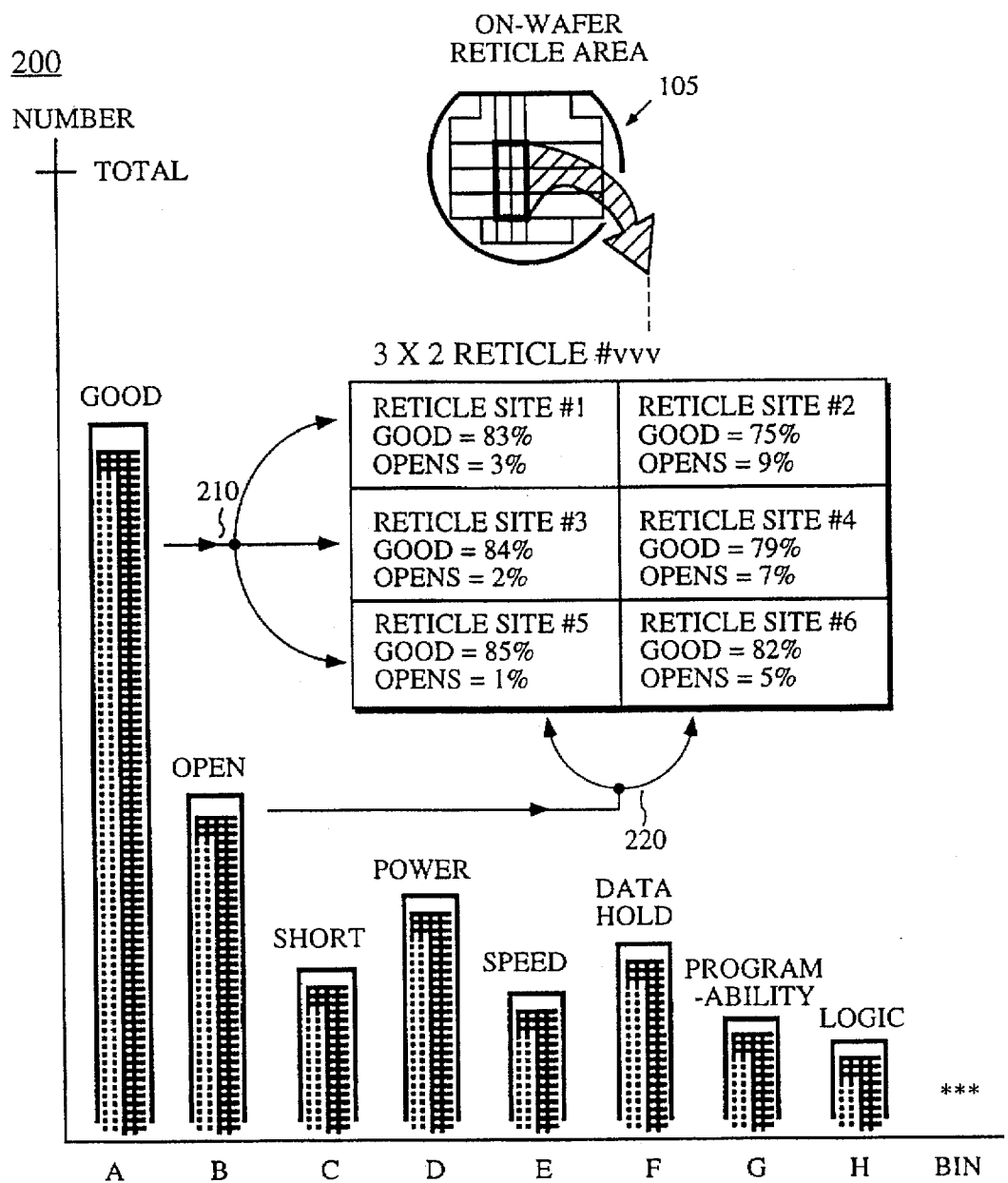
FIG. 2B shows how the values of various test-result bins correlate with intra-reticle site statistics.

Referring to FIG. 2B, each on-wafer die typically resides inside one or another reticle area such as the illustrated reticle area #vvv. The specific position of each on-wafer die within its respective reticle area may be defined by a corresponding intra-reticle site number. In the example of FIG. 2B, each reticle area on the wafer is a 2×3 matrix of six dice and the intra-reticle sites are numbered as 1 through 6. Each intra-reticle site corresponds to one IC die.

When appropriate identification is maintained between each FWS test result for each IC die and the corresponding intra-reticle site number, revealing statistics can be obtained for a given intra-reticle site number as taken across a whole wafer or as taken across a lot-full of wafers or as taken over a larger group wafers all having been produced by a same fabrication line (e.g., 101a or 101b).

For example, suppose that after the FWS test results for a lot-full of wafers is collected, the results are segregated according to intra-reticle site numbers and compared as such. A first such segregation of good-bin results (bin A) according to intra-reticle site numbers is indicated by distribution symbol 210. A second such segregation of open-bin results (bin B) according to intra-reticle site numbers is indicated by distribution symbol 220.

Suppose the good-bin (bin A) rate for intra-reticle site number #5 is consistently 85% across the lot while the good-bin rate for intra-reticle site number #2 (in the diagonally opposite corner of each reticle area) is consistently 75% across the same lot of wafers.

Such a strong correlation between intra-reticle site number #2 and consistently inferior results (a 10% less yield rate as compared to intra-reticle site number #5) points to a reticle-related problem as opposed to a test-equipment problem.

Perhaps there is a defect in corner #2 of a photomask used in one or both of fabrication lines 101a and 101b? Perhaps the problem is in that corresponding portion of the stepper optics? Perhaps there is a problem within a stepper used in one or both of fabrication lines 101a and 101b where the mask is not precisely aligning with previous on-wafer features, especially those in intra-reticle site number #2 or more loosely, with those along the right edge of the reticle area? (Note that in the example of FIG. 2B, the right side intra-reticle sites #2, #4 and #6 have lower yields across the lot as compared to the across-lot results of left side intra-reticle sites #1, #3 and #5.)

Perhaps the photoresist development light is not intense enough, especially at in intra-reticle site number #2 but also along the entire right edge of intra-reticle site numbers #2, #4 and #6?

An unusual deviation of FWS results keyed on intra-reticle site numbers suggests that the above or some other reticle-area related problem is a good possibility.

Taking the algorithm one step further, suppose FWS test results are segregated not only according to intra-reticle site number, but also according to fabrication line number (e.g., 101a or 101b) and/or according to a specific piece of fabrication line equipment that processed the corresponding wafer or lot of wafers. For example, suppose each wafer in the tested lot was processed either by stepper number 2101a {not shown, but understood to be in fabrication line 101a} or by stepper number 5101b {not shown, but understood to be in fabrication line 101b}, but not both.

Suppose that when FWS results across a large set of production wafers are further segregated according to whether the wafer was processed by stepper number 2101a or by stepper number 5101b, the yield statistics for intra-reticle site number #2 drop from 75% to 62% for stepper number 2101a and at the same time the yield statistics for intra-reticle site number #2 rise to 88% for stepper number 5101b? (The other good-bin yield results in each intra-reticle site of FIG. 2B would drop and rise accordingly for the respective stepper numbers and respective intra-reticle site numbers. The 75% yield result illustrated in intra-reticle site number #2 of FIG. 2B does not discriminate according to stepper number and it forms the average of 88% and 62%, meaning that each stepper handled half of the production load.) That would suggest with a high degree of confidence that the problem lies in stepper number 2101a as opposed to stepper number 5101b and that it is particularly acute for intra-reticle site number #2 when processed by stepper number 2101a.

If such a reticle-related case is detected by automatic statistical analysis carried out by DBC 150, then database computer 150 can be further programmed to automatically issue a shutdown instruction or recommendation 163 for the defective piece of fabrication line equipment, namely stepper number 2101a, and DBC 150 can be yet further programmed to automatically recommend to human investigators that they focus on the processing of intra-reticle site number #2 by that suspect stepper number 2101a.

FIG. 2B also shows by virtue of second distribution symbol 220 that FWS test results for a failure bin such as open-circuit bin (B) can be segregated according to intra-reticle site numbers. In the example of FIG. 2B, intra-reticle site number #2 again exhibits an unusually higher number of open-circuit failures (e.g., 9%) as compared to those of the other intra-reticle sites (e.g., as compared to the 1% open-circuit failure rate in intra-reticle site number #5). Such a deviation of results based on intra-reticle site number for a bad bin can suggest the fabrication line process that is responsible.

The high rate of open-circuit failures shown in FIG. 2B for example, suggests an intra-reticle area problem for the metal etch process. Perhaps there is an undesired hairline-like crack in the mask of the metal etch stepper for intra-reticle site number #2 which produces an undesired open circuit in one of the metal lines fairly frequently. If such a case is detected by automatic statistical analysis carried out by DBC 150, then database computer 150 can be further programmed to automatically issue a shutdown instruction or recommendation 163 for the defective piece of fabrication line equipment, namely the metal-etch stepper, and DBC 150 can be yet further programmed to automatically recommend to investigators that they focus on the processing of intra-reticle site number #2 by that suspect metal-etch stepper.

As earlier indicated, in addition to detecting problems in the fabrication lines 101a or 101b, it is desirable to detect problems with the test equipment as soon as possible and to timely alert the test equipment operator 109 rather than to continue with tests and perhaps discard dice or wafers that are good.

Figure 3:
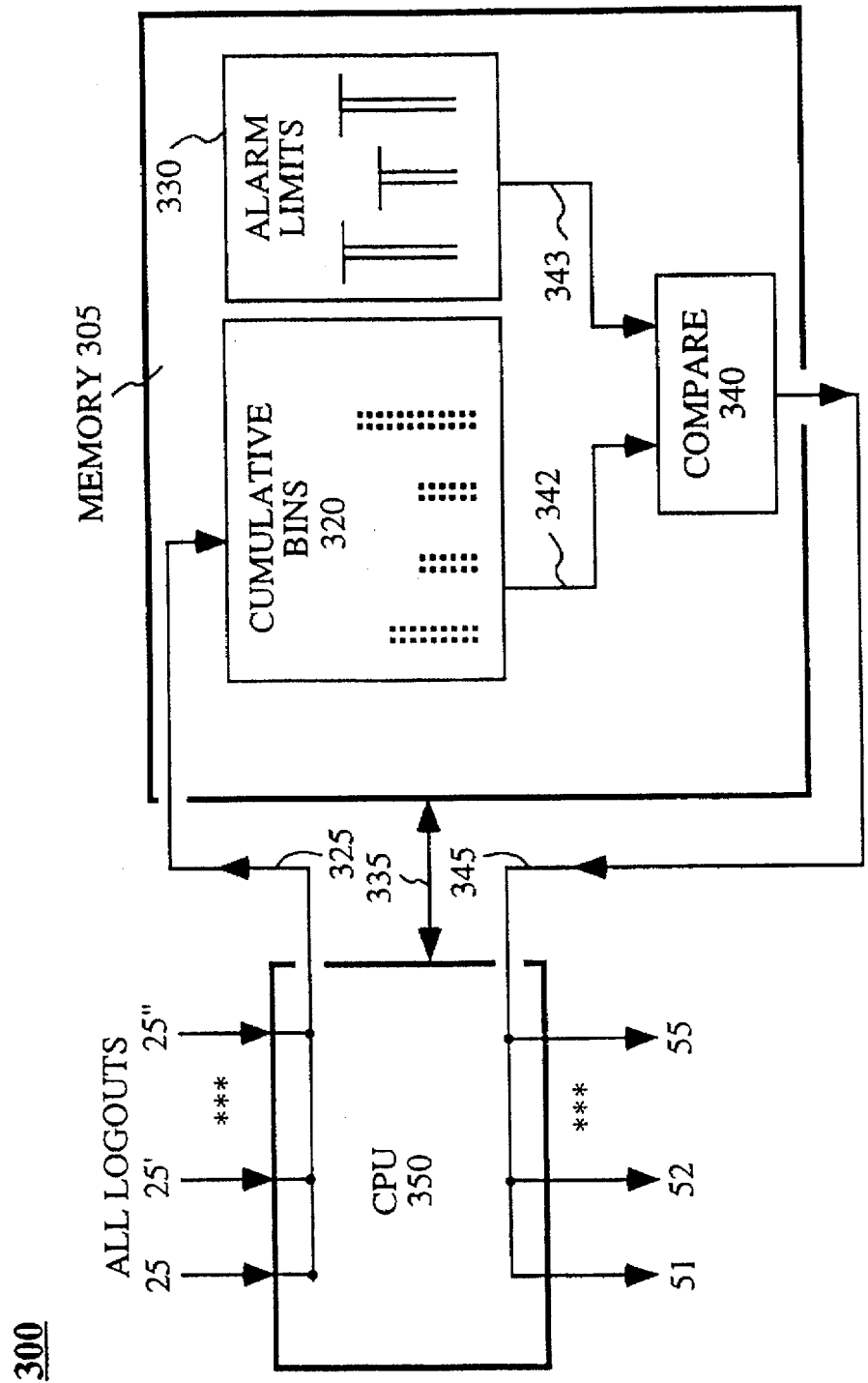
FIG. 3 shows a watchdog system proposed by a prior inventive entity.

Referring to FIG. 3, it has been proposed by a different inventive entity (which entity included present co-inventor, Chern-Jiann Lee) that a watchdog system be placed within a database computer 300 for collecting all log-out data from all test stations 110, 110' in undifferentiated form; for accumulating numbers for good and bad die in cumulative bins 320 irrespective of product-line and irrespective of intra-reticle site number, for comparing the counts in the cumulative bins 320 against pre-specified alarm limits 330; and for sounding an alarm or taking other appropriate action when the alarm limits are exceeded.

As seen in FIG. 3, the proposed database computer 300 includes a central processing unit (CPU) 350 operatively coupled to a memory system 305. Memory system 305 may include a bank of hard disk drives, tape drives and/or DRAM (dynamic random access memory) as appropriate. An operative connection 335 between memory system 305 and CPU 350 carries program instructions and data signals.

The cumulative log-out data is shown as signals 25, 25', ..., 25" which are collected from respective test stations 110, 110', ..., 110' (not all shown) and passed through CPU 350 by way of path 325 for storage in undifferentiable format in the cumulative bins 320 of memory system 305. Logout signals 25, 25', ..., 25" are not separated out according to the specific product-line for which they were produced (or according to other sorting criteria) but are rather collectively lumped together over an arbitrary time period.

A software-implemented comparator module 340 periodically compares the accumulated numbers in the cumulative bins 320 against the alarm limits 330, as indicated by functional connections 342 and 343, and issues an alarm by way of functional connection 345 when the limits are exceeded. The alarm is routed to one or more destinations as indicated by connections 51–55. (Connections 51–55 do not correspond one for one to the above disclosed connections 151–155.)

Figure 4:
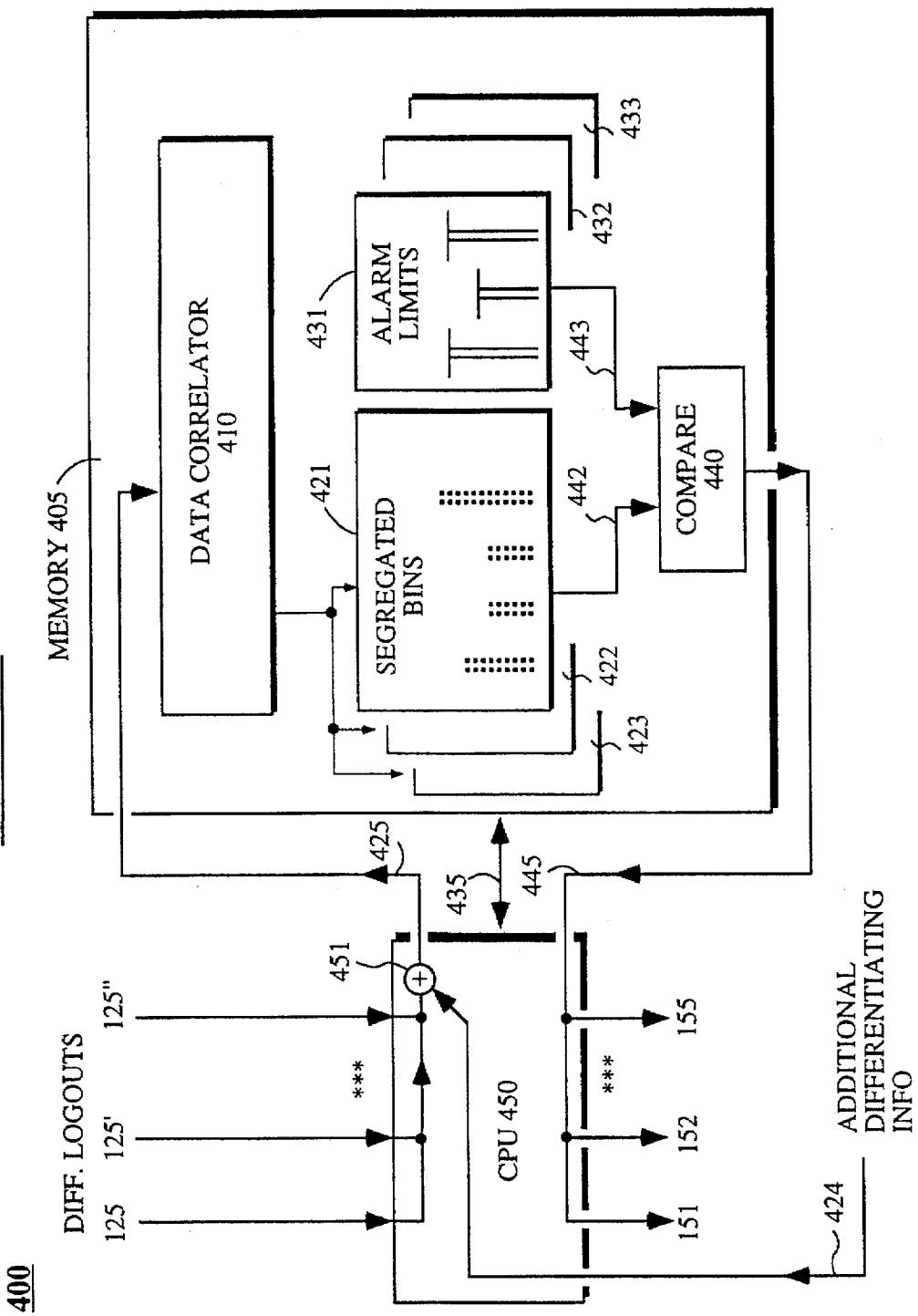
FIG. 4 shows a watchdog system in accordance with the invention.

Referring to FIG. 4, the present inventors realized that the proposed model 300 of FIG. 3 has some basic flaws. Each product-line (e.g., a wafer full-of microprocessor chips, a wafer full-of memory chips, etc.) has unique, product-specific characteristics. The proposed model 300 of FIG. 3 fails to take these into account and treats all wafers as if they were the same. All raw log-out data for all wafers is lumped together in an undifferentiable fashion by the proposed model 300 of FIG. 3.

The conclusions reached by comparator module 340 can be misleading and untrustworthy. Raw log-outs of test stations 110, 110' include data produced by set-up procedures. Proposed model 300 fails to segregate set-up results from production run results. They are all lumped together. A false alarm may be issued because of result data accumulated by a lengthy setup procedure.

Sometimes the FWS test equipment 110, 110' is used for testing pre-production engineering samples. Proposed model 300 fails to segregate pre-production engineering results from production run results. A false alarm may be issued because of result data accumulated by a lengthy engineering test run.

The list of problems with the proposed model 300 of FIG. 3 goes on but will not be further expounded on here.

An improved watchdog system 400 in accordance with the present invention is shown in FIG. 4. As seen in FIG. 4, the improved watchdog system 400 may be implemented as part of a database computer system (150) that includes a central processing unit (CPU) 450 operatively coupled to a memory system 405. Memory system 405 may include a bank of hard disk drives, tape drives, DRAM and/or SRAM (static random access memory) as appropriate. An operative connection 435 between memory system 405 and CPU 450 carries program instructions and data signals.

It is to be understood with regard to FIG. 4, that it is schematic in nature and that placement of various functional parts within either the block representing the data processing unit (CPU) 450 or within the block representing the memory system 405 is primarily for illustrative convenience. Those skilled in the art will appreciate that computer-implemented functional modules typically share the resources of both the system CPU 450 and the memory system 405 as well as other system hardware resources (e.g., system I/O) on a temporally and/or spatially multiplexed basis. The illustrative approach taken for FIG. 4 is not intended to imply that any one or more parts of the watchdog system 400 cannot be implemented by dedicated hardware instead of by resource-sharing software means and is further not intended to imply that watchdog system 400 is limited to having only the resources of a CPU 450 and a memory system 405.

The improved watchdog system 400 collects the raw log-out data 125, 125', 125", etc. from each respective piece of test equipment 110, 110', 110" (not shown), etc., but keeps each respective collection received from each piece of test equipment (e.g., 110) segregated from that of each other piece of test equipment (e.g., 110'). A differentiation means 451 adds additional, differentiating information signals 424 to each respective block of raw log-out data 125, 125', ... 125". The added differentiating information 424 enables the differentiation of the received test result data with respect to the corresponding specific product and/or product-line for which the test data was generated and/or enables differentiation of the collected test result data with respect to other distinguishing criteria as is detailed below.

The thus-produced differentiable log-out data 425 (raw data 125 plus added differentiating information 424) is used by a data correlator/sorter 410 included within the improved watchdog system 400 for filtering out irrelevant log-out data 425 (e.g. such as setup log-out data) and/or for discriminably routing relevant ones of the differentiable logouts 425 each to a respective one of a plurality of correspondingly-differentiated collection bins 421, 422, 423, etc.

In one type of database run, the segregated collection bins 421, 422, 423, etc. are segregated according to product number or according to product-line and the data accumulatively collected in each segregated storage and accumulation area 421, 422, 423, etc. is that which is specific to the corresponding product or product-line. A plurality of correspondingly differentiated alarm limit defining modules 431, 432, 433, etc. are provided in correspondence with the segregated collection bins 421, 422, 423, etc. for establishing respective, product-specific or otherwise-specific alarm limits.

During the testing of a lot of wafers, a software-implemented comparator module 440 repeatedly compares the accumulated numbers in the cumulative bins 421–423 against the respective alarm limits in the respective alarm-condition defining areas 431–433. This repetitive, criteria-differentiated comparison is indicated by way of functional connections 442 and 443.

The comparator module 440 issues an alarm signal or other automatically initiated response by way of functional connection 445 to a corresponding one or more of connections 151–155 when a respective one or more of the accumulated numbers in the discriminative accumulating bins 421–423 falls outside the corresponding and pre-defined, expected ranges of the alarm-limits defining modules 431, 432, 433, etc.

Of course, the alarm limits in the segregated alarm-limit defining modules 431, 432, 433, etc. are respectively set as functions of the data accumulation volumes (or data accumulation time durations) of their respective comparison categories (e.g., which can be on per-wafer basis, or per-lot basis, or per-week basis, etc.) and the contents of the corresponding collection bins 421, 422, 423, etc. are flushed after each respective comparison cycle.

The alarm-limit defining modules 431, 432, 433, etc. are also referred to herein, depending on context, as segregated alarm-condition defining modules 431, 432, 433, etc. and exception-condition defining modules 431–433, the latter reference being a more generic description of their functions. The comparator module 440 can be more generically viewed as a comparator means for testing data collected in each of the segregated collection bins against the exception-conditions defined by a respective one of the exception-condition defining modules and for automatically initiating a respective one or more exception-handling reactions when a respective one or more of the exception-conditions is satisfied. The automatically initiated exception-handling reactions include: the earlier mentioned re-instructing of the wafer disposition/inking station 107, as indicated by control connection 151; the generation of alarm signals 170 as indicated by control connection 152; the generation of trend reports 180 as indicated by control connection 153; and the generation of automatic shutdown control instructions as indicated by control connection 155 and the authorized subsequent flows of lines 161–163 in FIG. 1A.

The differentiable log-out data 425 is structured such that the data correlator/sorter 410 can sort the specially-formatted logouts 425 according to one or more of a plurality of filtering criteria. The filtering criteria may include, but is not limited to: (a) product-line; (b) production run versus set-up or engineering sample run; (c) equipment operator; (d) lot number; (e) wafer number; (f) date and time of test run; (g) location and serial number of test equipment; (h) prober set-up and run time configurations; (i) location and serial number of each piece of fabrication line equipment that processed each wafer; and (j) an intra-reticle site number associated with each die.

The data correlator/sorter 410 may be programmably configured to filter out from each data collection run, data that is irrelevant to a requested report. By way of example, log-out data generated by pre-test set-up or by engineering sample runs is irrelevant to reports that seek to detect patterns in actual mass-production test runs.

FIG. 5 illustrates an example of the differentiable log-out data 425, as stored in a machine-readable memory apparatus 500. Machine-readable memory apparatus 500 can be a magnetic hard disk, or digital storage tape, or RAM (random access memory), or other appropriate data storage means.

The differentiable log-out data 425 has a specific data structure 510 that allows for sorting of the raw result data by the data correlator/sorter 410 according to a variety of sort criteria. A specific example of the settings for each data field is shown in below Table-1.

Block 540 contains the raw log-out data while the remaining portions of data structure 510 contain the additional differentiating information 424 that is added on by differentiation means 451 to produce the differentiable log-out data 425.

Data structure 510 includes for each corresponding test run: (1) a product_identifier field 511 for identifying the product-line and/or the specific product within that line that is being tested; (2) a lot_number field 512 for identifying the specific cassette or lot of wafers that are being tested together and to which the present wafer belongs; (3) a wafer_number field 513 for identifying the specific wafer in the lot for which the data in block 540 constitutes the corresponding test results; (4) an operator_identification field 514 for identifying the specific machine operator who is operating the test equipment for the present test run; (5) a date_of_test-run field 515 for identifying the specific month, day and year in which the test was run; (6) a start_time_of_test-run field 516 for identifying the specific hour, minute and second in which the test on the specific wafer was begun; (7) a prober_equipment_identification field 519 for identifying the specific piece of prober equipment used during the testing of the respective wafer or lot; and (8) a prober_setup_configuration data block 520 for identifying specific stepping and orientation parameters of the prober 112–114 as used for testing the present lot or wafer.

One or more of the information in the product_identifier field 511, the lot_number field 512 and the wafer_number field 513 can be transmitted by way of connection 195 (FIG. 1A) from the DBC 150 to the workstream database computer 190, and the latter computer 190 can responsively return a list of all fabrication line equipment (in for example, lines 101a or 101b) that processed the given wafer, wafer lot and/or other set of samples of the identified product. Such a list of processing equipment is used in conjunction with intra-reticle site-number based studies for identifying marginal processing equipment.

The dice on each wafer may be arranged according to different schemes and stepped through during FWS testing according to different sequences. The prober_setup_configuration data block 520 specifies the stepping scheme presently loaded into the test station's programmably configurable prober 112–114 or otherwise established for the prober.

The data in the product_identifier field 511 and in the lot_number field 512 should be structured so as to allow differentiating between setup runs, engineering sample runs or other non-production runs and FWS tests of production lots.

The prober_setup_configuration data block 520 preferably includes respective X_step_amount and Y_step_amount fields for specifying the X and Y direction die to die pitches. This enables the automated detection of disparities between the prober stepping configuration and the die-to-die pitches of the wafer-under-test 105 as identified by the product_identifier field 511.

The prober_setup_configuration data block 520 can additionally include respective X_step_units and Y_step_units fields for specifying the units of measure respectively for the X_step_amount and Y_step_amount fields. The prober_setup_configuration data block 520 can further additionally include respective X_reference_position, Y_reference_position, X_reference_units and Y_reference_units fields for identifying a reference position used by a position measuring mechanism of the prober. The latter allows for detection of reference-related problems and for comparison of test data generated with different reference settings. A reference position of (0,0) can indicate that the reference position is the dead center point of the chuck 114.

The prober_setup_configuration data block 520 can yet further include a wafer_flat_orientation field for indicating the position of a flat edge of the wafer-under-test 105 relative to the dead center point of the chuck 114. The wafer_flat_ orientation is indicated in one embodiment as the angle made relative to the X axis by the perpendicular of the wafer flat passing through the dead center point of the chuck 114. This enables the automated detection of disparities between the prober stepping configuration and the oriented die-to-die pitches of the wafer-under-test 105.

Data structure 510 preferably further includes for each corresponding test run: a setup_control_file_pathname field 530 for identifying a specific control data file that is to be followed by the mainframe unit 120 and commonly used for controlling the testing of each die both during setup and subsequent FWS testing of a production lot of wafers.

The per-die setup control data file specifies the electronic probing pattern that is to be used. (Which test pads are to be electronically probed, when, and in what manner.) It also defines a bins mapping space wherein unique combinations of good and/or bad bins are each assigned a corresponding mapping code. The mapping code is used during testing to indicate test results for each die. A bins mapping code of say, 'Q' might be set to indicate for example that this die tests as being bad and that the detected defects of this die map into bad bins C, D and G of FIG. 2A.

The per-die setup control data file that is specified by the setup_control_file_pathname field 530 may further include specifications describing the automatic wafer alignment marks such as 105x of FIG. 1B that are to be searched for during the wafer alignment step and specifications for off-line inking of dice that test out as being bad. (Just because a die tests out as being bad does not mean that die is automatically inked as being bad. The inking procedure may call for a verifying re-test of that die before it is inked.) Note in the below example of Table-1 that the end portion of the setup_control_file_pathname matches the contents of the product_identifier field 511. A mismatch between these product specifiers can be used to automatically flag a test-procedure configuration error.

Data structure 510 further preferably includes for each corresponding test run: a test_system_identification field 531 for identifying the specific pieces of generic probe head (118–119) and mainframe (120) equipment used for carrying out this test and the physical locations of these generic pieces of equipment (118–120) at the time of test. The test_system_identification field 531 preferably includes both model number and serial number data for the generic probe head (118–119) and mainframe (120) equipment so that both the type of and the specific unit used during the test can be identified. The identification of the specific unit can be used for trend reporting on wear and tear problems, noise problems and other such problems associated with that specific unit or its locale. The identification of the unit type can be used for similar trend reporting covering all units of a particular type (e.g., memory versus logic).

Data structure 510 further preferably includes for each corresponding test run: a test_procedure_identification field 532 for identifying the specific test program to be executed by the mainframe unit 120 for generating the raw log-out data block 540. The test_procedure_identification field 532 preferably includes a program version subfield for identifying each revision of the test program so that anomalies due to changes of the test program can be correlated with the version numbers. In the below example of TABLE-1, the numerics in the test_procedure_identification field 532 match those stored in the product_identifier field 511. A mismatch can be used to automatically flag a test program error. The subfield 'AD' is the program version number.

Data structure 510 further preferably includes for each corresponding test run: a probe-card_identification field 535 for identifying the product-specific probe card 116 being used in the test. The probe-card_identification field 535 preferably includes a model number subfield and a part serial number subfield for respectively identifying the model and specific unit of the probe card 116 being used in the test. In the below example of TABLE-1, the model number subfield of the field 535 is '924' which partially matches the product-line designation '5924' of field 511. A mismatch can be used to automatically flag a probe card type error. The subfield '–S02' is the probe card serial number. This serial number subfield can be used for tracking wear and tear problems associated with this specific probe card 116.

Data structure 510 further includes for each corresponding test run: a reticle_area_configuration block 537 that defines the configuration of each reticle area. The reticle area configuration information defines how the maximum number of dice contained in each reticle area and how they are configured by site number. For example, if each reticle area can contain a maximum of twelve (12) dice, such an area may be rectangularly configured as one row by twelve columns of dice (1×12), or it may be configured as 2×6, or 6×2, or 3×4, or 4×3. It may also be configured nonrectangularly (e.g., in a tilable L-shape). The reticle_area_ configuration block 537 defines the configuration and respective intra-reticle site number assigned to each die in the configuration.

Reticle areas can be mapped onto the working area of a wafer in a variety of ways. For example, some reticle areas may extend partially out of the working area of the wafer in which case not all of the possible dice within the reticle area are actually implemented on the wafer. L-shaped reticle areas can be tiled in alternating upright and up side down orientations or other rotational orientations. Rectangular reticle areas can be tiled as staggered columns of reticle areas. Data structure 510 accordingly further includes for each corresponding test run: a reticle_area_tiling_map 538 that defines the mapping of the reticle areas onto the working area of the wafer and defines the number of working area dice that are included on the wafer for each respective intra-reticle site number. (If intra-reticle site number #2 is outside the wafer's working area for a given reticle area #vvv, then the total number of #2 intra-reticle sites on the wafer may be less than the total number of #4 intra-reticle sites on the same wafer.)

Data structure 510 further includes for each corresponding test run: a test_result_data block 540. The test_result_ data block 540 contains the conventional raw data log-out output of the given test station 110 for the given wafer 105. In the illustrated embodiment of below TABLE-1, each probed die has corresponding X and Y coordinates for identifying the die, an associated bins-mapping_code and an inking code. The X and Y coordinates can be crossreferenced with the reticle_area_tiling_map 538 and the reticle_area_configuration block 537 to determine the intra-reticle site number of each die.

An inking code of '0' in below TABLE-1 means the die is to be inked as being bad (defective). An inking code of '1' means the die is to be not-inked and is to be indicated as being good (passing the FWS test). A mapping code of '3' means the die should be assigned to the 'good' bin (bin A of FIG. 2A). Bad die can be assigned to one or more bad bins by their respective bin mapping codes.

Data structure 510 further preferably includes for each corresponding test run: a releasable_workstream_control_number field 550. The workstream control number is a number used by the workstream database computer 190 to track the progress of each lot of wafers. When the workstream control number of a given lot is released to the workstream database computer 190, the latter system takes this to mean that the lot has passed through the corresponding test station 110 with proper testing. If the workstream control number is not released, the workstream database computer 190 takes this to mean that the lot is still in the FWS testing stage.

According to one aspect of the invention, the workstream control number is not released to the workstream database computer 190 until after the database CPU 450 has tested the setup and result outputs of the given test station 110 to verify that the test station 110 is operating properly and the test result data of block 540 is trustable.

One way trustability is established is by using the comparator module 440 to compare the respective, accumulated differentiated log-out data 425 obtained from a given test station 110 during a latter portion of the test station's setup run and during the test station's subsequent wafer test run (which accumulated data is respectively stored in the respective, segregated collection bins 421, 422, 423, etc.). The differentiated log-out data 425 may be further compared against the expected result ranges defined in the corresponding, segregated collection bins 421, 422, 423, etc. If the respective, accumulated results of setup and/or actual test runs for a given test station 110 are within their respectively allocated normal-ranges, then it can be concluded that the test result data 540 for each corresponding wafer is trustable and releasable.

If the test result data of block 540 is not trustable for some reason, then the corresponding releasable_workstream_control_number (550) is not released to the workstream database computer 190. The testing of the corresponding wafer or wafer lot may be automatically repeated until the results become trustable and/or alarms may be automatically sent out to appropriate personnel or automated respondents requesting intervention and correction after no or a predefined number of test retries.

Data structure 510 further preferably includes for each corresponding test run: an end_of_file_marker field 551 for storing an end_of_file_marker (EOF). The EOF marker indicates to the DBC 150 that the storage location of the EOF marker is the logical end of the given collection of data 511 through 550 that makes up data structure 510.

The following TABLE-1 shows an example of the data field contents.

TABLE 1

| product_identifier= | 5924BW |
| lot_number= | C447J50 |

TABLE 1-continued

| wafer_number= | 13 {1:24} |
| operator_identification= | John Doe |
| date_of_test_run= | 2-17-95 |
| start_time_of_test_run= | 13:48:05 |
| prober_equipment_identification= | 3001X.D .249799-122SEG9 |
| prober_setup_configuration: | |
| X_step_amount= 2727 | X_step_units= 0.1 mil |
| Y_step_amount= 2912 | Y_step_units= 0.1 mil |
| X_reference_position= 0 | X_reference_units= 0.1 mil |
| Y_reference_position= 0 | Y_reference_units= 0.1 mil |
| wafer_flat_orientation= 90 | |
| setup_control_file_pathname= | C:\SET\3001\PBV\5924BW.SET |
| test_system_identification= | J953 -1 |
| test_procedure_identification= | WD5924....AD |
| probe_card_identification= | 924 -S02 |
| reticle_area_configuration= | 3×2 rectangular matrix |
| reticle_area_tiling_map= | C:\SET\3001\PBV\RATM.5924AW |
| test_result_data | |

| location | | bins-mapping_code | ink_control |
| --- | --- | --- | --- |
| X=1 | Y=0 | 3 | 1 |
| X=2 | Y=0 | 3 | 1 |
| X=3 | Y=0 | 3 | 1 |
| X=4 | Y=0 | Q | 0 |
| X=5 | Y=0 | 3 | 1 |
| X=6 | Y=0 | 3 | 1 |
| X=7 | Y=0 | 3 | 1 |
| X=8 | Y=0 | 3 | 1 |
| X=9 | Y=0 | C | 0 |
| X=10 | Y=0 | Q | 0 |
| X=11 | Y=1 | B | 0 |
| X=10 | Y=1 | 3 | 1 |
| *** | | | |
| X=3 | Y=15 | 3 | 1 |
| X=2 | Y=15 | 3 | 1 |
| X=1 | Y=15 | P | 0 |
| releasable_workstream_control_number= | | | 0700 |
| end_of_file_marker= | | | (EOF) |

In one particular embodiment, the RATM reticle_area_tiling_map has a configuration such as partially shown in below TABLE-2:

TABLE 2

| good_bin= | number 3 |
| max_number_sites_per_reticle= | 6 |
| max_number_dice_per_wafer= | 246 |
| max_number_dice_for_site1= | 40 |
| max_number_dice_for_site2= | 40 |
| max_number_dice_for_site3= | 42 |
| max_number_dice_for_site4= | 42 |
| max_number_dice_for_site5= | 41 |
| max_number_dice_for_site6= | 41 |

| Location | | Intra-reticle Site Number |
| --- | --- | --- |
| X=7 | Y=0 | 4 |
| X=6 | Y=0 | 6 |
| X=5 | Y=0 | 2 |
| X=4 | Y=0 | 4 |
| X=3 | Y=0 | 6 |
| X=2 | Y=0 | 2 |
| X=1 | Y=0 | 4 |
| X=0 | Y=0 | 6 |
| X=-1 | Y=0 | 2 |
| X=-2 | Y=0 | 4 |
| X=7 | Y=1 | 5 |
| X=6 | Y=1 | 3 |
| X=5 | Y=1 | 1 |
| X=4 | Y=1 | 5 |
| X=3 | Y=1 | 3 |
| X=2 | Y=1 | 1 |
| X=1 | Y=1 | 5 |
| X=0 | Y=1 | 3 |

TABLE 2-continued

| X=−1 | Y=1 | 1 |
| X=−2 | Y=1 | 5 |
| *** | *** | *** |

As already explained, block 540 contains the raw log-out data of the corresponding test station 110 while the remaining portions of data structure 510 contain added information 424 that is added on by differentiation means 451 to produce the differentiable log-out data 425.

The added differentiating information 424 can be manually input into the CPU 450 by the operator 109 via a keyboard or other appropriate input means.

In a more preferred implementation, as much as possible of the added differentiating information 424 is input into the CPU 450 automatically so as to minimize the danger of human data entry mistakes.

The test cassette 103 may include bar-code or other machine readable means (e.g., magnetic strip, OCR-readable strip) on which there is defined the information for the product_identifier field 511 and for the lot_number field 512. This information may be automatically read into the CPU 450 when the test cassette 103 is loaded into the prober.

The prober robotic arm (not shown) may have further means for generating the information of the wafer_number field 513 and for supplying it to the CPU 450 when the corresponding wafer is moved out of the test cassette 103. Alternatively, the information of one or more of the lot_number field 512 and of the wafer_number field 513 may be encoded in machine-readable OCR form or other form (e.g., bar code) on the wafer itself and scanned into the CPU 450 when the corresponding wafer is loaded onto the chuck 114.

The operator 109 may have an identification badge or other data-storing means that has a bar-code or other machine readable means (e.g., magnetic strip) on which there is defined the information for the operator_identification field 514. The test equipment may be configured such that the operator 109 must run his or her identification badge or equivalent by a scanner in order to initiate testing of a cassette 103 full of wafers. The operator_identification data is then automatically copied into field 514. This increases the probability that the correct operator_identification data will be entered into field 514 for each test run.

An automated clock mechanism (not shown) can be included in the DBC 150 for automatically logging the time and date of each wafer test and copying that data into the date_of_test-run field 515 and the start_time_of_test-run field 516 at the start of each test run.

Bar-code or other machine readable means (e.g., OCR, magnetic strip, a ROM cartridge) may be provided in association with each specific piece of prober equipment for generating the corresponding information for the prober_equipment_identification field 519. The test equipment may be configured such that a FWS test cannot be run until the bar-code or other machine readable means of the specific piece of prober equipment has been automatically or manually scanned and its information has been automatically copied into the prober_equipment_identification field 519 of the corresponding data structure 510.

Similarly, the data storage means within the prober that locally stores the information corresponding to that of the prober_setup_configuration data block 520 can be operatively coupled to the CPU 450 to automatically supply that information as part of the differentiating additional information 424.

Similarly, the data storage means within the mainframe unit 120 that locally stores the information corresponding to that of the setup_control_file_pathname field 530 and to that of the test_procedure_identification field 532 can be operatively coupled to the database CPU 450 to automatically supply the respective information to the CPU 450 as part of the differentiating additional information 424.

Moreover, each specific probe card 116 (and/or PS interface circuit 117) may have bar-code or other machine readable means (e.g., magnetic strip, local ROM) associated therewith for generating the corresponding information for the probe-card_identification field 535. The test equipment may be configured such that a FWS test cannot be run until the bar-code or other machine readable means of the specific probe card 116 (and/or PS interface circuit 117) has been automatically or manually scanned and its information has been automatically copied into the probe-card_identification field 535 of the corresponding data structure 510.

And in similar vein, each specific piece of generic test head equipment 118–119 may have bar-code or other machine readable means (e.g., magnetic strip, local ROM) associated therewith for generating the corresponding information for the test_system_identification field 531. The test equipment may be configured such that a FWS test cannot be run until the bar-code or other machine readable means of the specific piece of generic test head equipment 118–119 has been scanned and its information has been automatically copied into the test_system_identification field 531 of the corresponding data structure 510.

After the additional differentiating information 424 has been loaded into the database computer 150, the latter computer 150 can automatically check for inconsistencies between the product_identifier field 511, the prober_equipment_identification field 519, the prober_setup_configuration data block 520, the setup_control_file_pathname field 530, the test_procedure_identification field 532, and the probe-card_identification field 535 and issue an alarm in the case where there is a mismatch (e.g., where the wrong type of the probe card 116 is being used with the product now under test.) Such a cross-check helps to prevent waste of time due to use of inconsistent pieces of test equipment with respective wafers and helps to avoid consequential damage to the equipment and wafers.

Referring to FIG. 4 again, it should be apparent that once a complete, differentiable log-out 425 is defined for one or more given wafers 105 of a given lot where the lot belongs to a given product or product type and the lot is tested by a given test station 110, the log-out data 425 can be copied into the database computer 150 (which computer includes memory 405 and CPU 450). One or more of the collected and stored data log-outs 425 may be sorted by the data correlator 410 according to a variety of sorting criteria including, but not limited to, product or product type.

The raw log-out portions 540 of each such sorted group of data log-outs 425 may be accumulated into a respective collection bin, 421, 422, 423, etc. The contents of each thus-generated collection bin, 421, 422, 423, etc. may then be tested either immediately or at a later time against the expected bin profile ranges stored in a corresponding one of alarm-condition defining modules 431, 432, 433, etc. Appropriate exception action may be automatically taken when one or more bins of the collected log-out data 425 are found to be abnormal with respect to the normal bin profiles defined in the respective alarm-condition defining modules 431–433. The exception action can include repeating the FWS testing of a suspect one or more wafers and/or issuing an immediate alarm or a time-delayed warning report.

The so-called 'normal' and 'abnormal' ranges of each of the alarm-condition defining modules 431–433 may be defined manually by a computer programmer. They may be defined by repeated test runs executed on known-good wafers. They may be alternatively or supplementally defined by performing automated statistical analysis on previously collected and differentiable log-outs 425 for each given sort group using predefined variance definitions (for what constitutes 'normal' and 'abnormal'). The statistically-generated norms may each be for specific products or for an accumulation of different products belonging to a same product family.

Preferably, a segregated collection bin 421, 422, 423, etc. is formed for each wafer immediately after that wafer is tested by the FWS equipment and the segregated collection bin 421, 422, 423, etc. is immediately compared (440) against the contents of a corresponding per-wafer, alarm-condition defining module 431–433. If the log-out results 540 generate an exception, corrective action can be taken substantially immediately rather than waiting for bad results form large numbers of wafers. The type of corrective action taken will depend on the magnitude of variance between the raw log-out results 540 and the norms defined in the alarm-condition defining module 431–433.

The immediate verification at the time of collection of each wafer log-out 425 is but one of many checks that the database computer 150 can perform when given differentiable log-outs each having a data structure such as 510 of FIG. 5.

Figure 6:
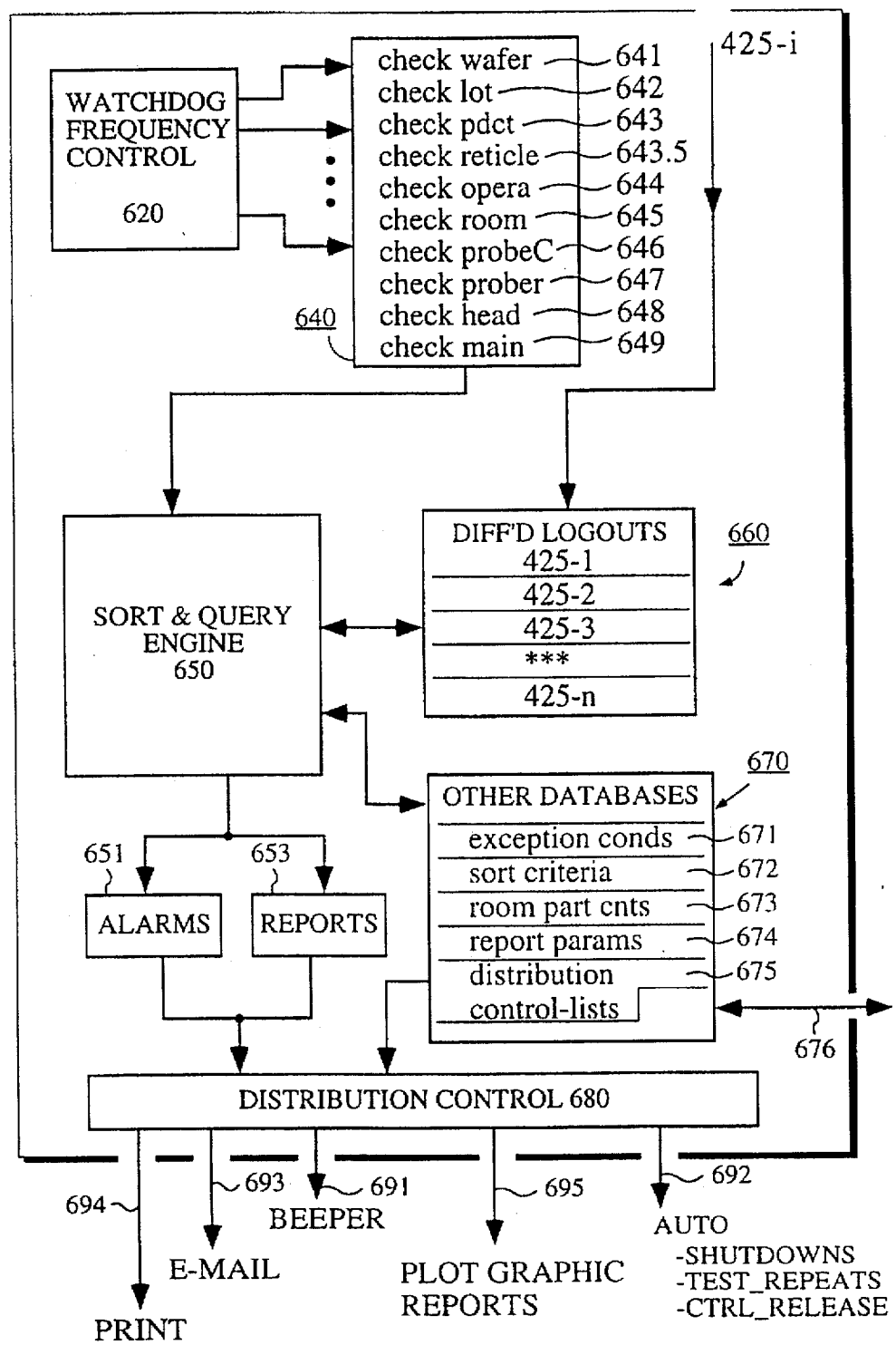
FIG. 6 illustrates how the differentiable log-out data is used for periodically generating trend reports and for generating alarms when exceptions occur.

FIG. 6 shows an improved database computer 150' having a first memory means 660 for collecting and storing differentiable log-outs 425-1, 425-2, 425-3 ... 425-n in substantially the same time that each respective log-out 425-i is produced by a given piece of test equipment 110, 110', etc.

Database computer 150' includes a further memory means 670. The second memory means 670 includes a first database 671 for storing the respective exception-defining conditions (e.g., alarm triggers) for each measurable aspect of the FWS testing operation. The exception-defining conditions of first database 671 may be established for log-out data 425 on a per-wafer basis, on a per-lot basis, on a per-product family basis, on a per-{intra-reticle site} basis, on a per-equipment operator basis, on a per-physical-location (per room) basis, on a per-probe-card basis, on a per-prober basis, on a per-test head basis, and/or on a per-mainframe basis.

Database computer 150' includes a sort-and-query engine 650 that is operatively coupled to the first and second memory means, 660 and 670, for sorting the incoming log-out data 425-i according to one or more predefined sort criteria 672 (e.g., by product type) and for testing the collected and sorted log-out data 425-i against the various exception-defining conditions stored in memory region 671 and for issuing appropriate alarm signals 651 when exceptions are detected. The alarm signals 651 are understood to include automatic response or reaction commands for shutting down various other pieces of equipment (e.g., 107, 112, 101, 104) that operate in combination with the database computer 150', or for causing the other pieces of equipment (e.g., 107, 112) to repeat their respective operations, or for allowing other automatic systems to advance in state (e.g., with a control release), as indicated at 692 in FIG. 6.

Although the sort-and-query engine 650 is shown as a single unit in FIG. 6, it is within the contemplation of the invention to instead have two or more subunits connected in pipelined fashion for respectively and in chronological parallelism, carrying out the data sort or filtration function and the function of automatically analyzing pre-filtered (or pre-sorted) groups of log-out and other data for detecting exception-conditions, statistical trends, historical trends, and so forth.

The frequency at which the differentiated log-out database 660 is tested against each respective type of exception-definition 671 is determined by a watchdog frequency control unit 620.

As seen at 640, a task-list is prepared and stored for execution by the sort-and-query engine 650. The task-list 640 includes executable commands 641–649. A first such command 641 instructs the sort-and-query engine 650 to check the log-out database 660 against the exception-definitions 671 on a per-wafer basis for the most recently logged-in reports 425-i (e.g., those that came in the last 5 minutes). This verification 641 on a most-recent per-wafer basis preferably occurs with the greatest frequency over other tasks 642–649 of task-list 640.

Task-list 640 may further include a second command 642 for instructing the sort-and-query engine 650 to check the most recently completed lots against their respective per-lot exception-definitions 671.

The checking of a given product or product-line over a specific time period such as the most recent week or most recent month may also be undertaken periodically as indicated by third task instruction 643. To carry out the instructed third task 643, the sort-and-query engine 650 would first sort through the collected log-outs 660 searching for log-out records 425-i having a product_identifier field 511 matching a predefined first pattern and further having a date_of_test-run field 515 matching a second predefined pattern. The test_result_data blocks 540 of these sorted-out records would then be combined additively or otherwise and tested against appropriate exception-definitions 671 for out-of-range conditions, for excessive statistical variances and so forth. Alarms 651 would be issued for out-of-range conditions. Historical trend reports 653 would also be issued for each product or product-line to indicate improvements or deteriorations in various bin categories such as FWS yield (bin A of FIG. 2), improper power consumption (bin D of FIG. 2), etc.

Task-list 640 may further include a command 643.5 for instructing the sort-and-query engine 650 to segregate FWS test results according to intra-reticle site number (see FIG. 2B) for a given lot, or a given product, or a given product family, or another subset of the wafers and to compare the thus segregated results to see if there are any significant deviations based on intra-reticle site number. Each intra-reticle site number could also have a correspondingly unique set of exception-definitions 671 assigned to it, which set is automatically tested against at the time that the segregate by intra-reticle site-number command 643.5 is executed.

The performance of each equipment operator 109 can also be tested as indicated by fourth task instruction 644. To do this, machine log-outs 425 would be sorted according to the operator_identification field 514. An average performance profile may be obtained for all operators and then the sorted-out records of each given operator 109 would be compared against the average or against some other exception-definitions 671. Alarm signals 651 would be issued for operators who, for example, correlate with unusually high or unusually low FWS test yields. Performance trend reports 653 can also be developed on a per-operator basis.

The performance of FWS equipment in a given physical location (such as a given test room) may also be watched on a periodic basis as indicated by fifth task instruction 645 by using the data structure 510 of FIG. 5. In this case, log-out records would be sorted according to the text_system_ identification field 531 to extract the data associated with test equipment residing in a particular locale. The test result data 540 of each locale would be tested against alarm levels and/or statistically derived norms defined by corresponding exception-definitions 671. Alarms 651 would be issued in the case of unexpected out-of-range results for a given room. Trend reports 653 would also be issued on a periodic basis for each room. In this way, the manager of an FWS test department can detect locale-related abnormalities and long-term trends (e.g., trends evolving over weeks or months).

By way of a more specific example, each clean room may include an air particle counter (not shown) for keeping track of the number and/or size of dirt particles sampled from the ambient atmosphere of that room. The periodic room particle counts would be collected in database region 673 and each associated with its respective locale (its cleanroom area). The sort-and-query engine 650 may then automatically establish a correlation between the performance of each locale and its respective room particle counts 673.

As mentioned above, each probe-card (115–116) is subject to wear and tear. It is advisable to replace a worn-down probe-card before the probe-card's error rate exceeds acceptable limits. The sort-and-query engine 650 may be programmed to periodically test the results of each specific probe-card against predefined alarm limits 671 and/or statistical norms as indicated by sixth task instruction 646. For this task 646, the sort-and-query engine 650 can use the probe-card_identification field 535 of data structure 510 to extract the log-out data associated with a specific probe-card (or specific set of probe-cards). The sort-and-query engine 650 would then process this probe-card specific data as appropriate (e.g., by adding the respective bin counts associated with worn probe-card pins), and it would compare the processed data against respectively appropriate exception-definitions 671. Alarms 651 and trend reports 653 would be issued as appropriate.

The prober equipment 112–114 is similarly subject to wear and tear and other problems. The prober_equipment_ identification field 519 of data structure 510 may be similarly used to extract the log-out records 425 of specific probers 112–114 for comparison against alarm triggers 671 and statistical norms.

Similarly, each piece of test head equipment 118–119 and mainframe equipment 120 may be checked using the test_system_identification field 531.

Trend reports 653 for various pieces of equipment may be generated during time periods when there is none or a relatively low rate of log-out information 425-i coming in for collection by the database computer 150'. During periods of relatively heavier log-out traffic, the watchdog frequency control 620 should be instructing the sort-and-query engine 650 to primarily perform watchdog activities on a per-wafer and per-lot basis (tasks 641 and 642). In this way, alarm signals 651 for immediately relevant exception-conditions may be issued with relative immediacy.

The format of each alarm signal (or alarm message) 651 or trend report 653 may be controlled by a report-parameters database 674 stored in memory region 670.

In addition to the illustrated database contents of second memory means 670, other database contents can be imported in from other computer systems as indicated by connection 676 and the results produced by the sort-and-query engine 650 can be similarly exported out for use by the other computer systems. One of the other computer systems with which information is shared by way of connection 676 is the workstream database computer 190 (FIG. 1A).

In particular, if a problem that is acute for a particular one or more intra-reticle site numbers is detected, the database computer 150' sends the corresponding lot number (or other wafer subset identifier) to the workstream database computer 190 with a request for a list of the fabrication line equipment that was used to process that subset of wafers. Different subset definitions are tried until a piece of fabrication line equipment that is common to a particular problem that correlates with the same intra-reticle site number or numbers is isolated.

A distribution control mechanism 680 is provide for routing alarm signals 651 and trend reports 653 to various personnel or automated correction equipment as appropriate. Highly-unusual query results may call for the sending of an immediate alarm message 691 to the wireless beeper or other annunciator of the shift operator or manager. Such highly-unusual query results may also call for the automatic issuance 692 of a shutdown command 161–163 to the test or production equipment that correlates with the unusual query results. In some situations, the distribution control mechanism 680 may be given authorization to block inking of a particular one or more wafers by the wafer disposition/inking station 107 and to instead automatically re-route the wafers and initiate (692) a repeat of a particular FWS test on those wafers at a particular test station 110. The distribution control mechanism 680 may even be authorized to automatically release (692) the workstream control number (field 550) of successfully tested lots.

Statistical and historical trend reports 653 may be sent by electronic mail (E-mail) 693 to the electronic mailboxes of appropriate persons listed on a distribution list 675 provided for each type of report. Alternatively, or additionally, alarm messages 651 and trend reports 653 may be sent to a hard-copy printer 694 for subsequent manual distribution. Plots of trend data may also be sent to a graphic plotter 695 where appropriate. The report-parameters database 674 can define the format of each automatically generated textual report and/or graphic plot.

The above disclosure is to be taken as illustrative of the invention, not as limiting its scope or spirit. Numerous modifications and variations will become apparent to those skilled in the art after studying the above disclosure.

By way of example, the following short and long term trend studies can be carried out using the disclosed data structure 510 and database system:

(a) percent yield (bin A over total wafers) versus time for each product and/or product family;

(b) passing volume of product (bin A on a passing die-count basis or wafer-count basis or lots-count basis) versus time for each product and/or product family;

(c) statistical values for percent yield and volume accumulated over a predefined time period and calculated to give statistical mean, standard deviation, Cp and Cpk;

(d) percent yield (bin A over total wafers) versus time for each piece of test head equipment 115–118;

(e) percent yield (bin A over total wafers) versus time for each probe card with probes 115–116;

(f) percent yield (bin A over total wafers) versus time for each equipment operator 109;

(g) passing volume of product (bin A) versus time for each equipment operator 109;

(h) system utilization in terms of productive test time and idle time;

(i) accumulated utilization time and/or accumulated wafer volume for each swappable piece of equipment versus scheduled maintenance point so that degradable equipment such as probe cards 115–116 are replaced or re-tuned close to schedule;

(j) historical yield (bin A) trends, overall and by product;

(k) historical reject (bin B-etc.) trends, overall and by product;

(l) percent yield (bin A over total wafers) versus intra-reticle site number for each lot, product and/or product family; and (m) historical reject (bin B-etc.) trends by combination of product number and intra-reticle site number.

Given the above disclosure of general concepts and specific embodiments, the scope of protection sought is to be defined by the claims appended hereto and substantial equivalents thereof.

What is claimed is:

1. A machine-implemented watchdog system for monitoring the operations of one or more units of final wafer sort (FWS) test equipment, where each unit of FWS test equipment participates as part of one or more FWS test stations in FWS testing of plural dice provided on each of a supplied plurality of wafers from a given production lot of wafers, said FWS testing being for verifying high-level functionality of the tested dice, wherein each FWS test station outputs for each wafer tested by said test station, a corresponding block of raw result data indicative of which dice tested as functional or not, said system comprising:

(a) receiving means for receiving respective blocks of raw result data from each respective test station, each received block of raw result data indicating FWS test results obtained by the respective test station for a respectively tested wafer;

(b) differentiating means for adding to each received block of raw result data, additional information signals, said additional information signals enabling the sorting of the blocks of raw result data according to one or more predefined sorting criteria, the combination of each block of raw result data and the correspondingly added additional information signals defining differentiable result data; and (c) storing means for storing the differentiable result data.

2. The machine-implemented watchdog system of claim 1 wherein said additional information signals include a product_identifier field for identifying a product-line or a specific product within a given product line to which the tested wafer belongs and with which the respectively received block of raw result data is to be associated.

3. The machine-implemented watchdog system of claim 1 wherein said additional information signals include a lot_number field for identifying a specific cassette or lot of wafers that are being tested together and to which the tested wafer belongs and with which the respectively received block of raw result data is to be associated.

4. The machine-implemented watchdog system of claim 3 wherein said additional information signals further includes a wafer_number field for uniquely distinguishing the tested wafer from the remaining wafers of said cassette or lot of wafers.

5. The machine-implemented watchdog system of claim 1 wherein said additional information signals includes a operator_identification field for identifying a specific machine operator responsible for operating the respective test station from which the respectively received block of raw result data is obtained.

6. The machine-implemented watchdog system of claim 1 wherein said additional information signals includes a date_of_test-run field for identifying the date on which the FWS testing was performed to produce said received block of raw result data.

7. The machine-implemented watchdog system of claim 6 wherein said additional information signals further includes a start_time_of_test-run field for identifying the time within said date at which the FWS testing was begun to produce said received block of raw result data.

8. The machine-implemented watchdog system of claim 1 wherein:

(d.1) the respective test station of each received block of raw result data includes and uses a specific prober unit and a set of probes for carrying out said FWS testing, the prober unit being for bringing each respective wafer-under-test into alignment with the corresponding set of probes; and (b.1) said additional information signals includes a prober_equipment_identification field for identifying the specific prober unit used during the FWS testing that produced said received block of raw result data.

9. The machine-implemented watchdog system of claim 8 further wherein:

(d.2) each prober unit is programmably configurable for stepping through differing arrangements of dice on each wafer; and (b.2) said additional information signals includes a prober_setup_configuration data block for identifying a specific stepping arrangement loaded into the programmably configurable prober unit during the FWS testing that produced said received block of raw result data.

10. The machine-implemented watchdog system of claim 1 wherein:

(d.1) the respective test station of each received block of raw result data includes and uses a mainframe unit for controlling the carrying out said FWS testing and a preceding setup procedure; and (b.1) said additional information signals includes a setup_control_file_pathname field for identifying a specific control data file to be commonly used by the mainframe unit for controlling the testing of each die during setup or subsequent FWS testing of a production lot of wafers.

11. The machine-implemented watchdog system of claim 1 wherein:

(d.1) the respective test station of each received block of raw result data includes and uses specific pieces of generic probe head equipment and a mainframe unit for carrying out said FWS testing, the generic probe head equipment being for operatively coupling the mainframe unit to the wafer-under-test via additional product-specific equipment; and (b.1) said additional information signals includes a test_system_identification field for identifying the specific pieces of generic probe head equipment used for carrying out said FWS testing.

12. The machine-implemented watchdog system of claim 1 wherein:

(d.1) the respective test station of each received block of raw result data includes and uses a mainframe unit for controlling the carrying out said FWS testing and a preceding setup procedure; and (b.1) said additional information signals includes a test_procedure_identification field for identifying a specific test program to be executed by the mainframe unit for generating said received block of raw result data.

13. The machine-implemented watchdog system of claim 1 wherein:

(d.1) the respective test station of each received block of raw result data includes and uses a product-specific probe card as part of the one or more units FWS test equipment for carrying out said FWS testing, the product-specific probe card being for interfacing with a wafer-under-test having dice of a specific product; and (b.1) said additional information signals includes a probe-card_identification field for identifying the product-specific probe card used during the FWS testing that produced said received block of raw result data.

14. The machine-implemented watchdog system of claim 13 further wherein:

(b.2) said additional information signals includes a date_of_test-run field for identifying the date on which the FWS testing was performed to produce said received block of raw result data.

15. The machine-implemented watchdog system of claim 1 wherein:

(d.1) a production line monitoring system tracks workflow progress for each respective lot of wafers to which the respective wafer of each received block of raw result data belongs; and (b.1) said additional information signals includes a releasable_workstream_control_number field for conditional release to said production line monitoring system upon determination that the FWS testing performed to produce said received block of raw result data was properly performed.

16. The machine-implemented watchdog system of claim 1 further comprising:

(d) data correlator means, responsive to said additional information signals of said differentiable result data, for segregating the corresponding blocks of raw result data according to one or more of the predefined sorting criteria and routing the segregated blocks of raw result data to correspondingly segregated collection bins.

17. The machine-implemented watchdog system of claim 16 further comprising:

(e) a plurality of exception-condition defining modules, each corresponding to one of said segregated collection bins, for defining exception-conditions which when satisfied, warrant an exception-handling reaction; and (f) comparator means for testing data collected in each of said segregated collection bins against the exception-conditions defined by a respective one of said exception-condition defining modules and for automatically initiating a respective one or more exception-handling reactions when a respective one or more of the exception-conditions is satisfied.

18. The machine-implemented watchdog system of claim 17 wherein:

(f.1) the respective test station of each received block of raw result data forwards each respectively-tested wafer to a programmably-preconfigured wafer disposition/inking station for subsequent and automatic processing of the forwarded wafer; and (f.2) said automatically initiated exception-handling reactions include re-instructing the wafer disposition/inking station regarding the subsequent and automatic processing of the forwarded wafer in the case where a respective exception-condition is satisfied for said wafer and the satisfied exception-condition is predesignated as calling for said re-instructing of the wafer disposition/inking station.

19. The machine-implemented watchdog system of claim 17 wherein said automatically initiated exception-handling reactions include generation of an alarm signal in the case where a respective exception-condition is satisfied and the satisfied exception-condition is predesignated as calling for said alarm signal.

20. The machine-implemented watchdog system of claim 17 wherein said automatically initiated exception-handling reactions include generation of a trend report in the case where a respective exception-condition is satisfied and the satisfied exception-condition is predesignated as calling for said trend report.

21. The machine-implemented watchdog system of claim 17 wherein said automatically initiated exception-handling reactions include generation of an automatic shutdown control instruction in the case where a respective exception-condition is satisfied and the satisfied exception-condition is predesignated as calling for said shutdown control instruction.

22. The machine-implemented watchdog system of claim 1 wherein said additional information signals include reticle_area_configuration information for identifying an intra-reticle site number associated with each die on which the FWS testing was performed to produce said received block of raw result data.

23. A computer-readable data storage apparatus storing differentiable result data obtained from one or more final wafer sort (FWS) test stations, said data storage apparatus including:

(a) first means storing raw result data obtained from one or more final wafer sort tests run by respective ones of the FWS test stations on a corresponding one or more wafers; and (b) second means storing wafer-identifying data identifying each unique wafer from which a correspondingly stored portion of said raw result data was produced.

24. A data storage apparatus according to claim 23 further comprising:

(c) third means storing test equipment identifying data identifying the FWS test station which produced the correspondingly stored raw test result data.

25. A data storage apparatus according to claim 24 further comprising:

(d) fourth means storing time-of-test data identifying the time at which a corresponding FWS test was run on said identified FWS test station for producing the corresponsingly raw test result data.

26. A data storage apparatus according to claim 23 further comprising:

(c) third means storing product identification data identifying a specific product or specific product line or specific lot of wafers that was tested to produce the the correspondingly stored raw test result data.

27. A data storage apparatus according to claim 23 further comprising:

(c) third means storing test equipment identifying data identifying one or more specific portions of a respective FWS test station which participated in the production of a correspondingly stored portion of the raw test result data.

28. A data storage apparatus according to claim 27 wherein:

the one or more final wafer sort (FWS) test stations include a replaceable, product-specific probe card; and said test equipment identifying data identifies a specific probe card used for producing a corresponding stored portion of said raw result data.

29. A data storage apparatus according to claim 23 further comprising:

(c) third means storing operator_identification data identifying a specific machine operator responsible for operating a respective FWS test station from which a corresponding stored portion of said raw result data was obtained.

30. A data storage apparatus according to claim 23 wherein:

each FWS test station is programmably configurable for stepping through differing arrangements of dice on each wafer; and said data storage apparatus further comprises:

(c) third means storing setup_configuration data identifying a specific stepping arrangement loaded into the programmably configurable FWS test station from which a corresponding stored portion of said raw result data was obtained.

31. A data storage apparatus according to claim 23 wherein:

each FWS test station is programmably configurable for carrying out different test procedures on supplied wafers; and said data storage apparatus further comprises:

(c) third test_procedure_identification data identifying a specific test procedure that was performed and from which a corresponding stored portion of said raw result data was obtained.

32. A data storage apparatus according to claim 23 wherein:

each wafer includes a plurality of die arranged as tiled reticle areas, and said data storage apparatus further comprises:

(c) third means storing reticle_area_configuration information identifying an intra-reticle site for each die on which the FWS testing was performed to produce a corresponding stored portion of said raw result data.

33. A machine-implemented test system comprising:

(a) collecting means for collecting blocks of raw log-out data from a respective one or more test stations;

(b) data differentiating means for adding differentiating information to each of the collected blocks of raw log-out data and for thereby producing differentiable log-out data, said differentiable log-out data being structured to enable differentiation of each of said blocks of raw log-out data according to one or more predefined sorting criteria;

(b) sorting means for sorting through the differentiable log-out data in accordance with one or more of said predefined sorting criteria and for thereby defining one or more groups of differentiated log-out data; and (c) exception-condition detecting means for testing the one or more groups of differentiated log-out data against exception-conditions defined by a respective one or more exception-condition defining modules and for initiating a respective one or more exception-handling responses upon detection of the satisfaction of a respective one or more of said exception-conditions.

34. A machine-implemented test system according to claim 33 further comprising:

(d) alarm means responsive to the exception-condition detecting means for generating an alarm signal in response to satisfaction of a corresponding one or more of said exception-conditions that is pre-designated as warranting the issuance of said alarm signal.

35. A machine-implemented test system according to claim 33 further comprising:

(d) trend reporting means responsive to the exception-condition detecting means for generating a historical trend report in response to satisfaction of a corresponding one or more of said exception-conditions that is pre-designated as warranting the issuance of said historical trend report.

36. A machine-implemented test system according to claim 33 further comprising:

(d) shutdown control means responsive to the exception-condition detecting means for generating one or more shutdown commands to predefined ones of production equipment operating in conjunction with said test stations, said generation of the one or more shutdown commands being in response to satisfaction of a corresponding one or more of said exception-conditions that is pre-designated as warranting the issuance of said one or more shutdown commands.

37. A machine-implemented managing system for managing operations of a final wafer sort (FWS) testing facility having one or more test stations, said managing system comprising:

(a) first storage means for automatically collecting and storing blocks of differentiable log-out data obtained from respective testing of one or more wafers by a respective one or more of the FWS test stations, said differentiable log-out data being differentiable according to a plurality of predefined sorting criteria including product type and date of testing;

(b) second storage means for storing exception-definitions;

(c) sort-and-query means, operatively coupled to the first and second storage means, for automatically sorting through the stored, differentiable log-out data in accordance with one or more of said predefined sorting criteria, for thereby defining one or more groups of differentiated log-out data corresponding to the predefined sorting criteria, for automatically testing the one or more groups of differentiated log-out data against the stored exception-definitions, and for automatically detecting satisfaction of a respective one or more of said exception-conditions by the tested one or more groups of differentiated log-out data.

38. A machine-implemented managing system according to claim 37 wherein:

(c.1) the sort-and-query means is further for issuing alarm signals upon detection of the satisfaction of a respective one or more of said exception-conditions; and the managing system further comprises:

(d) distribution control means, operatively coupled to the sort-and-query means, for distributing the issued alarm signals to predefined destinations.

39. A machine-implemented managing system according to claim 38 wherein the predefined destinations include a wireless beeper.

40. A machine-implemented managing system according to claim 38 wherein the predefined destinations include an electronic mailbox.

41. A machine-implemented managing system according to claim 37 further comprising:
- (d) watchdog frequency control means, operatively coupled to the sort-and-query means, for defining a repeat rate at which the sort-and-query means is to repeatedly perform a respective one or more sort and query tasks.

42. A machine-implemented managing system according to claim 41 further comprising:
- (e) task-list means, operatively coupled to the watchdog frequency control means and to the sort-and-query means, for storing a list of and thereby defining the one or more of the sort and query tasks that are to be repeatedly performed by the sort-and-query means.

43. A machine-implemented managing system according to claim 42 wherein the sort and query tasks of said task-list means includes:
- (e.1) a first task command instructing the sort-and-query means to check the differentiable log-out data stored in the first storage means against corresponding ones of the stored exception-definitions on a per-wafer basis, said checking only covering differentiable log-out data belonging to a first predefined time period.

44. A machine-implemented managing system according to claim 43 wherein the sort and query tasks of said task-list means further includes:
- (e.2) a second task command for instructing the sort-and-query means to secondly check the differentiable log-out data stored in the first storage means against corresponding ones of the stored exception-definitions on a per-lot basis, said checking only covering such secondly-checked differentiable log-out data belonging to a second predefined time period.

45. A machine-implemented managing system according to claim 43 wherein the sort and query tasks of said task-list means further includes:
- (e.2) a second task command for instructing the sort-and-query means to secondly check the differentiable log-out data stored in the first storage means against corresponding ones of the stored exception-definitions on a per-product basis, said checking only covering such second-checked differentiable log-out data belonging to a second predefined time period.

46. A machine-implemented method for reviewing test result data obtained from testing by one or more final wafer sort (FWS) test stations of wafers from one or more production lots, said method comprising the steps of:
- (a) obtaining raw test result data from each test station indicating raw test results for a respectively tested wafer;
- (b) adding to the raw test result data additional data for distinguishing the obtained raw test result data according to a plurality of sorting criteria, said sorting criteria including time of test and the identity of test equipment participating in the production of the raw test result, said adding step producing differentiable test result data; and
- (c) storing the differentiable test result data in a machine-readable storage means.

47. A machine-implemented watchdog system for monitoring the operations of one or more units of final wafer sort (FWS) test equipment, where each unit of FWS test equipment participates as part of one or more FWS test stations in FWS testing of plural dice provided on each of a supplied plurality of wafers from a given production lot of wafers, said FWS testing being for verifying high-level functionality of the tested dice in accordance with one or more predefined test procedures, wherein the tested dice are associated with specific product lines, wherein each FWS test station is operated under supervision of an identifiable operator, and wherein each FWS test station outputs for each wafer tested by said test station, a corresponding block of raw result data indicative of which dice tested as functional or not, said system comprising:
- (a) a receiving unit for receiving raw result data from each respective test station the received raw result data indicating FWS test results obtained by the respective test station for a respectively tested wafer; and
- (b) a differentiating unit for adding to the received raw result data, additional information signals, said additional information signals enabling the sorting of the raw result data according to one or more predefined sorting criteria;
  wherein said predefined sorting criteria include use of one or more of the following sort-keys:
  - (c.1) the product line of the tested dice;
  - (c.2) the lot of the tested dice;
  - (c.3) the operator responsible for supervising the testing of the dice;
  - (c.4) the time of the testing of the dice; and
  - (c.5) the test procedure used in the testing of the dice.

* * * * *